(12) United States Patent
Lee

(10) Patent No.: US 11,664,363 B2
(45) Date of Patent: May 30, 2023

(54) LIGHT EMITTING DEVICE AND METHOD OF MANUFACTURING THE SAME

(71) Applicant: Seoul Viosys Co., Ltd., Ansan-si (KR)

(72) Inventor: Chung Hoon Lee, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 20 days.

(21) Appl. No.: 16/598,545

(22) Filed: Oct. 10, 2019

(65) Prior Publication Data
US 2020/0126963 A1    Apr. 23, 2020

Related U.S. Application Data

(60) Provisional application No. 62/746,873, filed on Oct. 17, 2018.

(51) Int. Cl.
| | | |
|---|---|---|
| *H01L 33/62* | (2010.01) | |
| *H01L 25/00* | (2006.01) | |
| *H01L 25/065* | (2023.01) | |
| *H01L 33/00* | (2010.01) | |
| *H01L 27/15* | (2006.01) | |

(52) U.S. Cl.
CPC .......... *H01L 25/50* (2013.01); *H01L 25/0655* (2013.01); *H01L 33/0093* (2020.05); *H01L 33/62* (2013.01); *H01L 27/15* (2013.01); *H01L 2933/0066* (2013.01)

(58) Field of Classification Search
CPC . H01L 25/50; H01L 25/0655; H01L 25/0753; H01L 33/0093; H01L 33/62; H01L 27/15; H01L 2933/0066; H01L 2933/0058
See application file for complete search history.

(56) References Cited

U.S. PATENT DOCUMENTS

| | | | |
|---|---|---|---|
| 10,096,740 B1 | 10/2018 | Chen | |
| 10,446,605 B2 | 10/2019 | Zhang | |
| 2011/0297998 A1* | 12/2011 | Akimoto | ................. H01L 33/62 |
| | | | 257/E21.53 |
| 2012/0261699 A1* | 10/2012 | Ooyabu | ................ H01L 33/505 |
| | | | 257/E33.061 |
| 2014/0091329 A1* | 4/2014 | Lee | ........................... F21K 9/00 |
| | | | 257/E33.061 |

(Continued)

FOREIGN PATENT DOCUMENTS

| | | |
|---|---|---|
| KR | 10-2017-0079940 | 7/2017 |
| WO | 2018-129697 | 7/2018 |

OTHER PUBLICATIONS

International Search Report dated Jan. 30, 2020 in International Application PCT/KR2019/013626.

(Continued)

*Primary Examiner* — Monica D Harrison
*Assistant Examiner* — John Lin
(74) *Attorney, Agent, or Firm* — H.C. Park & Associates, PLC

(57) ABSTRACT

A method for manufacturing a light emitting device including forming a plurality of first light emitting cells and a plurality of second light emitting cells on one surface of a first substrate, providing a second substrate to face the first and second light emitting cells, selectively bonding the first light emitting cells onto the second substrate, and cutting the second substrate to a mounting unit including at least two first light emitting cells.

12 Claims, 29 Drawing Sheets

(56) References Cited

U.S. PATENT DOCUMENTS

| | | |
|---|---|---|
| 2014/0186979 A1 | 7/2014 | Tu et al. |
| 2015/0295154 A1* | 10/2015 | Tu ........................... H01L 24/73 |
| | | 438/27 |
| 2016/0293811 A1 | 10/2016 | Hussell et al. |
| 2016/0336304 A1 | 11/2016 | Wu et al. |
| 2016/0351767 A1* | 12/2016 | Choi ..................... H01L 25/167 |
| 2017/0069609 A1 | 3/2017 | Zhang et al. |
| 2018/0122787 A1 | 5/2018 | Chu et al. |
| 2018/0145057 A1* | 5/2018 | Ulmer ................. H01L 25/0753 |
| 2018/0166424 A1* | 6/2018 | Sim ...................... H01L 33/483 |
| 2018/0204826 A1 | 7/2018 | Or-Bach et al. |
| 2018/0287098 A1 | 10/2018 | Hu et al. |

OTHER PUBLICATIONS

Extended European Search Report dated Jun. 20, 2022, issued in European Patent Application No. 19873767.8.

* cited by examiner

LIGHT EMITTING DEVICE AND METHOD OF MANUFACTURING THE SAME

CROSS-REFERENCE TO RELATED APPLICATION

This application claims priority from and the benefit of U.S. Provisional Application No. 62/746,873, filed on Oct. 17, 2018, which is hereby incorporated by reference for all purposes as if fully set forth herein.

BACKGROUND

Field

Exemplary embodiments of the invention relate generally to a light emitting device and a method for manufacturing the same, and more specifically, to a light emitting device which includes a plurality of light emitting cells.

Discussion of the Background

Light emitting diodes, as inorganic light sources, are being widely used in various fields, such as display devices, vehicle lamps, and general lighting. Light emitting diodes are rapidly replacing existing light sources due to their longer lifetime, lower power consumption, and faster response speed than the existing light sources.

In general, a display device displays various colors by utilizing mixed colors of blue, green, and red. Each pixel of a display device includes blue, green, and red sub-pixels, the color of a particular pixel is determined through the colors of these sub-pixels, and an image is displayed by a combination of pixels.

Light emitting diodes have been mainly used as backlight sources in display devices. However, recently, a micro LED display has been developed as a next generation display, which directly implements images by using light emitting diodes.

The above information disclosed in this Background section is only for understanding of the background of the inventive concepts, and, therefore, it may contain information that does not constitute prior art.

SUMMARY

Light emitting devices constructed according to exemplary embodiments of the invention provide excellent color reproducibility.

Exemplary embodiments also provide a method for manufacturing a light emitting device that can reduce a portion of a wafer from being wasted.

Additional features of the inventive concepts will be set forth in the description which follows, and in part will be apparent from the description, or may be learned by practice of the inventive concepts.

A method for manufacturing a light emitting device according to an exemplary embodiment includes the steps of forming a plurality of first light emitting cells and a plurality of second light emitting cells on one surface of a first substrate, providing a second substrate to face the first and second light emitting cells, selectively bonding the first light emitting cells onto the second substrate, and cutting the second substrate into a mounting unit including at least two first light emitting cells.

The method may further include forming a light shielding layer substantially filling an area between the first light emitting cells.

The method may further include forming, on the first substrate, a dielectric layer between the first and second light emitting cells, the dielectric layer having openings exposing top surfaces of the first light emitting cells, forming bonding parts to fill the openings, and forming pads passing through the bonding parts and electrically coupled with the respective first light emitting cells.

The step of selectively bonding of the first light emitting cells onto the second substrate may include forming bonding parts on the first light emitting cells, separating the first light emitting cells from the first substrate by selectively performing a laser lift-off process at portions of the first substrate corresponding to the first light emitting cells, and bonding the separated first light emitting cells onto the second substrate by the bonding parts.

Neighboring first light emitting cells may be spaced apart by a first distance in a first direction and by a second distance in a second direction perpendicular to the first direction, neighboring second light emitting cells may be spaced apart by a third distance in the first direction and by a fourth distance in the second direction, and one second light emitting cell may be disposed between two neighboring first light emitting cells.

The method may further include mounting the first light emitting cells of the mounting unit to a mounting substrate at once.

A plurality of metal balls may be formed in the shape of a grid on the mounting substrate.

The method may further include selectively bonding the second light emitting cells onto a third substrate, and cutting the third substrate to a mounting unit including at least two second light emitting cells.

The method may further include selectively forming bonding parts on the first light emitting cells on the first substrate, turning over the first substrate, such that the first light emitting cells formed with the bonding parts and the second light emitting cells face a third substrate, separating the first light emitting cells from the first substrate, bonding the separated first light emitting cells to the third substrate through the bonding parts, turning over the third substrate and bonding one surfaces of the first light emitting cells to a fourth substrate, exposing the bonding parts by removing the third substrate, and forming pads passing through the respective bonding parts and are electrically coupled with the respective first light emitting cells.

The method may further include forming a light shielding layer between the first light emitting cells on the third substrate.

A light emitting device according to another exemplary embodiment includes a substrate, at least two light emitting cells disposed on the substrate, a light shielding layer disposed between the at least two light emitting cells, and having openings each exposing one surface of each of the light emitting cells, and bonding parts filling the openings, and disposed between the light emitting cells and the substrate.

One surface of the light shielding layer facing the substrate may be coplanar with one surface of each of the bonding parts.

The light shielding layer may contact the substrate and be disposed between the bonding parts and the substrate.

A separation distance between two neighboring light emitting cells may be about 8 to about 15 times a critical dimension of each of the light emitting cells.

Each of the light emitting cells may include a first light emitting part, a second light emitting part, and a third light emitting part vertically stacked one over another, and a plurality of pads electrically coupled with the first, second, and third light emitting parts.

The light emitting device may further include through electrodes passing through the bonding parts and electrically coupled with the pads.

Each of the through electrodes may include a first portion disposed within each of the bonding parts and a second portion extending from the first portion onto a top surface of each of the bonding parts.

The second portion may extend to one surface of the light shielding layer facing the substrate.

The second portion may extend into the light shielding layer.

The substrate may include a plurality of substrate pads disposed at positions corresponding to the second portions of the through electrodes.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1A:
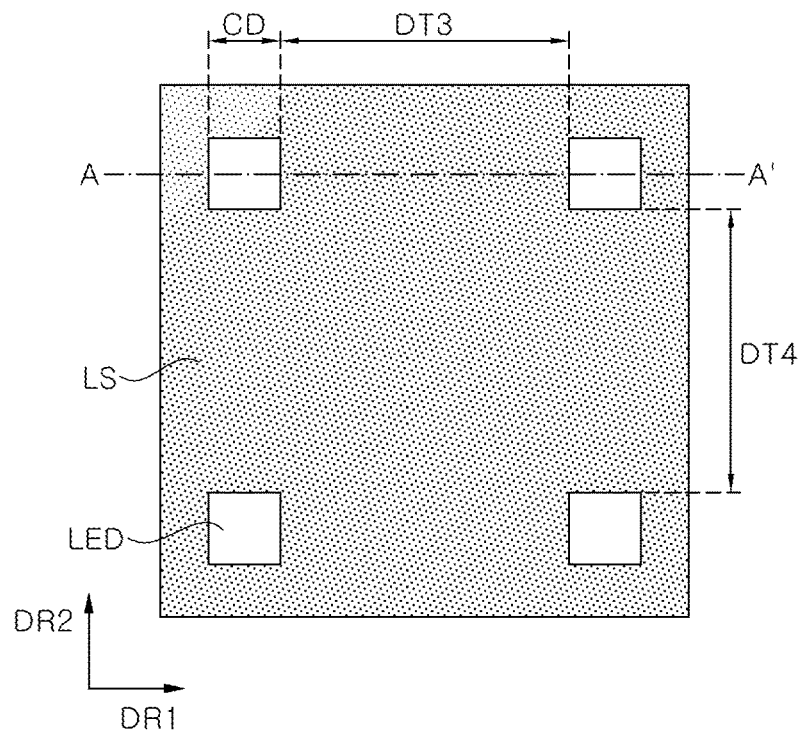
FIG. 1A is a schematic top view of a light emitting device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 1B:
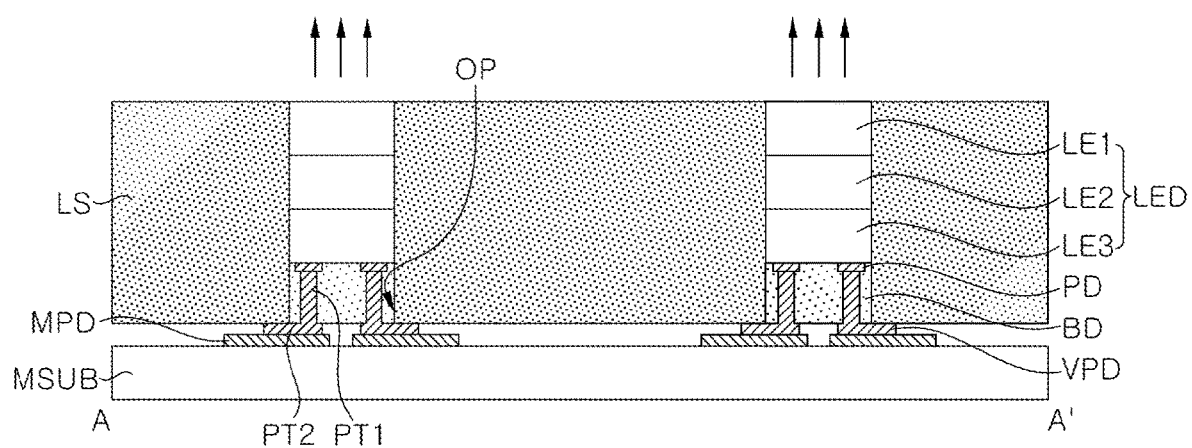
FIGS. 1B and 1C are cross-sectional views taken along line A-A' of FIG. 1A according to exemplary embodiments.
Figure 1C:
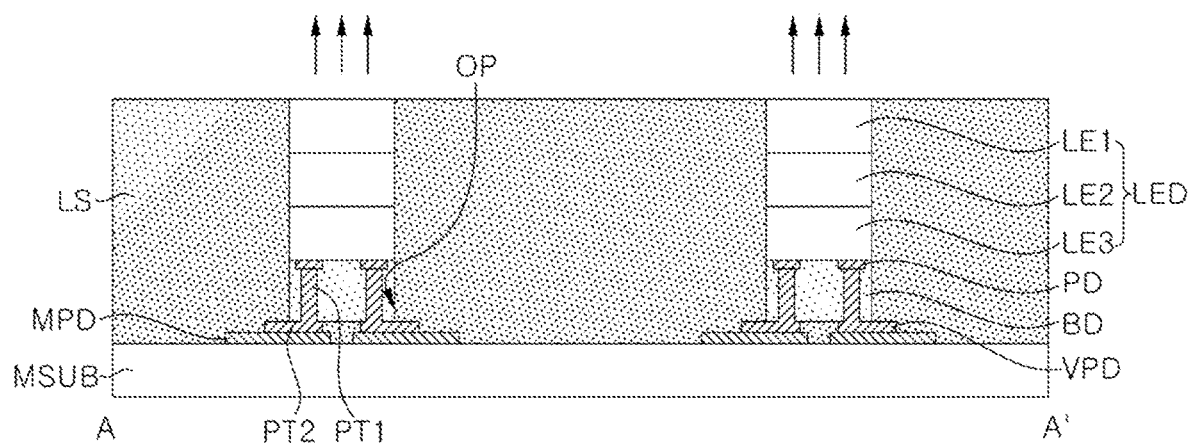

FIG. 1A is a schematic top view of a light emitting device according to an exemplary embodiment, and FIGS. 1B and 1C are cross-sectional views taken along line A-A' of FIG. 1A according to exemplary embodiments.

Referring to FIGS. 1A to 1C, a light emitting device may include a mounting substrate MSUB and a plurality of light emitting cells LED disposed on one surface of the mounting substrate MSUB.

According to the illustrated exemplary embodiment, the plurality of light emitting cells LED include four light emitting cells LED arranged in a 2×2 configuration. However, the inventive concepts are not limited to a particular number of the light emitting cells LED or a particular arrangement thereof. For example, the plurality of light emitting cells LED may include at least two light emitting cells LED. As another example, the plurality of light emitting cells LED may include nine light emitting cells LED arranged in a 3×3 configuration. Four to nine light emitting cells LED may form a mounting unit that may be mounted at one time during a mounting process, which will be described in more detail later.

The plurality of light emitting cells LED may be disposed to be separated from one another in a first direction DR1 and a second direction DR2 perpendicular to the first direction DR1. More particularly, the plurality of light emitting cells LED may be separated by a third distance DT3 in the first direction DR1, and by a fourth distance DT4 in the second direction DR2. For example, the third distance DT3 and the fourth distance DT4 may be substantially the same with each other. As another example, the third distance DT3 and the fourth distance DT4 may be different from each other.

According to an exemplary embodiment, each of the third distance DT3 and the fourth distance DT4 may be about 8 to about 15 times the critical dimension (CD) of one light emitting cell LED. For example, when each light emitting cell LED is 50 μm to 80 μm, each of the third distance DT3 and the fourth distance DT4 between two neighboring light emitting cells LED may be approximately 400 μm to 1200 μm, more particularly, about 650 μm to 700 μm.

Each of the plurality of light emitting cells LED may include a first light emitting part LE1, a second light emitting part LE2, and a third light emitting part LE3. According to an exemplary embodiment, each light emitting cell LED may have a structure, in which the first light emitting part LE1, the second light emitting part LE2, and the third light emitting part LE3 are vertically stacked. In this case, the third light emitting part LE3 may face the mounting substrate MSUB, and one surface of the first light emitting part LE1 may be a light extraction surface. According to an exemplary embodiment, the wavelength of light emitted from the first light emitting part LE1 may be the shortest, and the wavelength of light emitted from the second light emitting part LE2 may be longer than the wavelength of light emitted from the first light emitting part LE1 and shorter than the wavelength of light emitted from the third light emitting part LE3. The wavelength of the light emitted from third light emitting part LE3 may be the longest. For example, the first light emitting part LE1 may emit blue light, the second light emitting part LE2 may emit green light, and the third light emitting part LE3 may emit red light, without being limited thereto. For example, according to another exemplary embodiments, the second light emitting part LE2 may emit light having a wavelength shorter than that of the first light emitting part LE1. In some exemplary embodiments, each light emitting cell LED may have a structure, in which at least one of the first light emitting part LE1, the second light emitting part LE2, and the third light emitting part LE3 is horizontally disposed to be separated from one another.

Each light emitting cell LED may include a plurality of pads PD, which are electrically coupled with the first light emitting part LE1, the second light emitting part LE2, and the third light emitting part LE3, respectively. According to an exemplary embodiment, each of the plurality of pads PD may be disposed between the third light emitting part LE3 and the mounting substrate MSUB.

The light emitting device may further include a light shielding layer LS disposed between the light emitting cells LED. The light shielding layer LS may surround the outer sidewalls of the light emitting cells LED, and may substantially fill an area between the light emitting cells LED. According to an exemplary embodiment, the light shielding layer LS may include openings OP, which expose the light emitting cells LED, respectively. The light shielding layer LS may include a material, which has an insulation property and a light shielding characteristic. For example, the light shielding layer LS may include a material, such as a photoresist or a black matrix.

As the light shielding layer LS is disposed between adjacent light emitting cells LED, and light emitted from respective light emitting cells LED may not exert an influence on one another. In this manner, a color mixing may be prevented, and the light emitting device may have improved color reproducibility. In some exemplary embodiments, the light shielding layer LS may be selectively omitted.

The light emitting device may further include bonding parts BD, which cover the pads PD of the light emitting cells LED, and substantially fill the openings OP of the light shielding layers LS between respective third light emitting parts LE3 and the mounting substrate MSUB. One surface of each of the bonding parts BD may be brought into contact with each of the third light emitting parts LE3, and may have substantially the same size as each light emitting cell LED when viewed from the top.

Each of the bonding parts BD may include a polymer. For example, each of the bonding parts BD may include at least one of a photoresist, epoxy, BCB (benzocyclobutene), Flare™ as a series of PAE (poly arylene ether), MSSQ (methylsilsesquioxane), PMMA (polymethylmethacrylate), PDMS (polydimethylsiloxane), fluoropolymer, a polyimide, MSSQ (methylsilsesquioxane), PEEK (polyethereherketone), ATSP (aromatic thermosetting polyester), PVDC (polyvinylidene chloride), LCP (liquid-crystal polymer), and a wax. For example, each of the bonding parts BD may include a thermosetting polymer, which is cured at a temperature of about 100° C. to about 300° C.

The light emitting device may include through pads VPD, which are electrically coupled with the plurality of pads PD of each light emitting cell LED, and pass through each bonding part BD. Each of the through pads VPD may include a first portion PT1 which passes through the bonding part BD, and a second portion PT2 which extends from the first portion PT1 to the one surface of the bonding part BD.

Referring to FIG. 1B, one surface of the light shielding layer LS according to an exemplary embodiment may be coplanar with the one surface of each bonding part BD. The other surface of the light shielding layer LS facing away the mounting substrate MSUB may be coplanar with the one surface of the first light emitting part LE1. As such, each of the second portions PT2 of the through pads VPD of the light emitting cells LED and mounting pads MPD may be exposed between the light shielding layer LS and the bonding parts BD and the mounting substrate MSUB. The second portion PT2 of each of the through pads VPD may extend to not only the bonding part BD but also to one surface of the light shielding layer LS.

Referring to FIG. 1C, the one surface of the light shielding layer LS according to another exemplary embodiment may contact with the mounting substrate MSUB. The second portions PT2 of the through pads VPD of the light emitting cells LED and the mounting pads MPD may be covered by the light shielding layer LS. The second portion PT2 of each of the through pads VPD may extend into the light shielding layer LS.

The mounting substrate MSUB may include a circuit therein, such as a printed circuit board (PCB).

The mounting substrate MSUB may include the mounting pads MPD at positions corresponding to the through pads VPD. The mounting pads MPD may be electrically bonded with the through pads VPD by a material, such as solder balls.

As the second portion PT2 of each of the through pads VPD extends to the bonding part BD and/or the one surface of the light shielding layer LS, the light emitting cells LED may be mounted to the mounting substrate MSUB, which includes the mounting pads MPD that may have various structure depending on the dispositions and the extending lengths of the through pads VPD.

Hereinafter, a light emitting cell will be described in more detail.

Figure 2A:
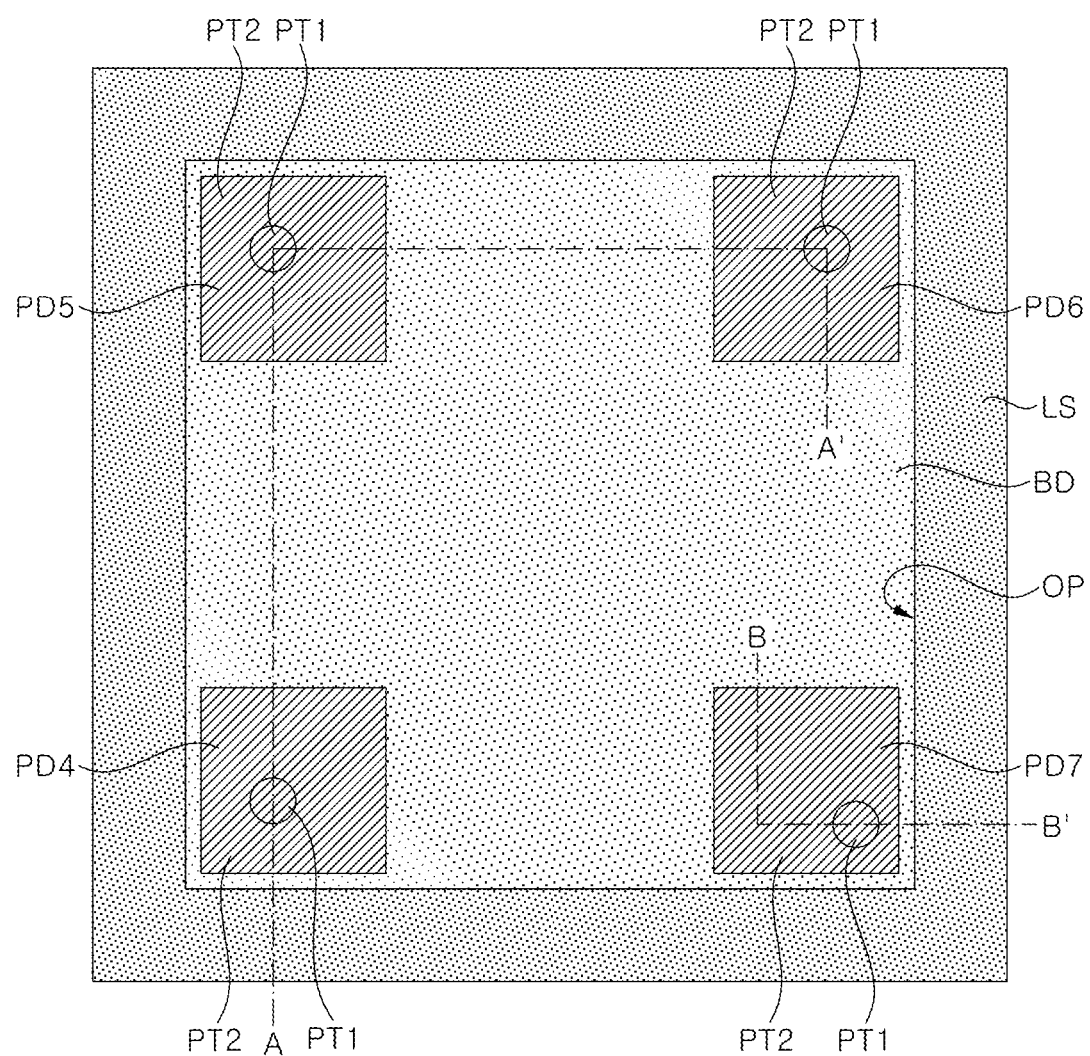
FIG. 2A is a schematic top view of a light emitting cell according to an exemplary embodiment.
Figure 2B:
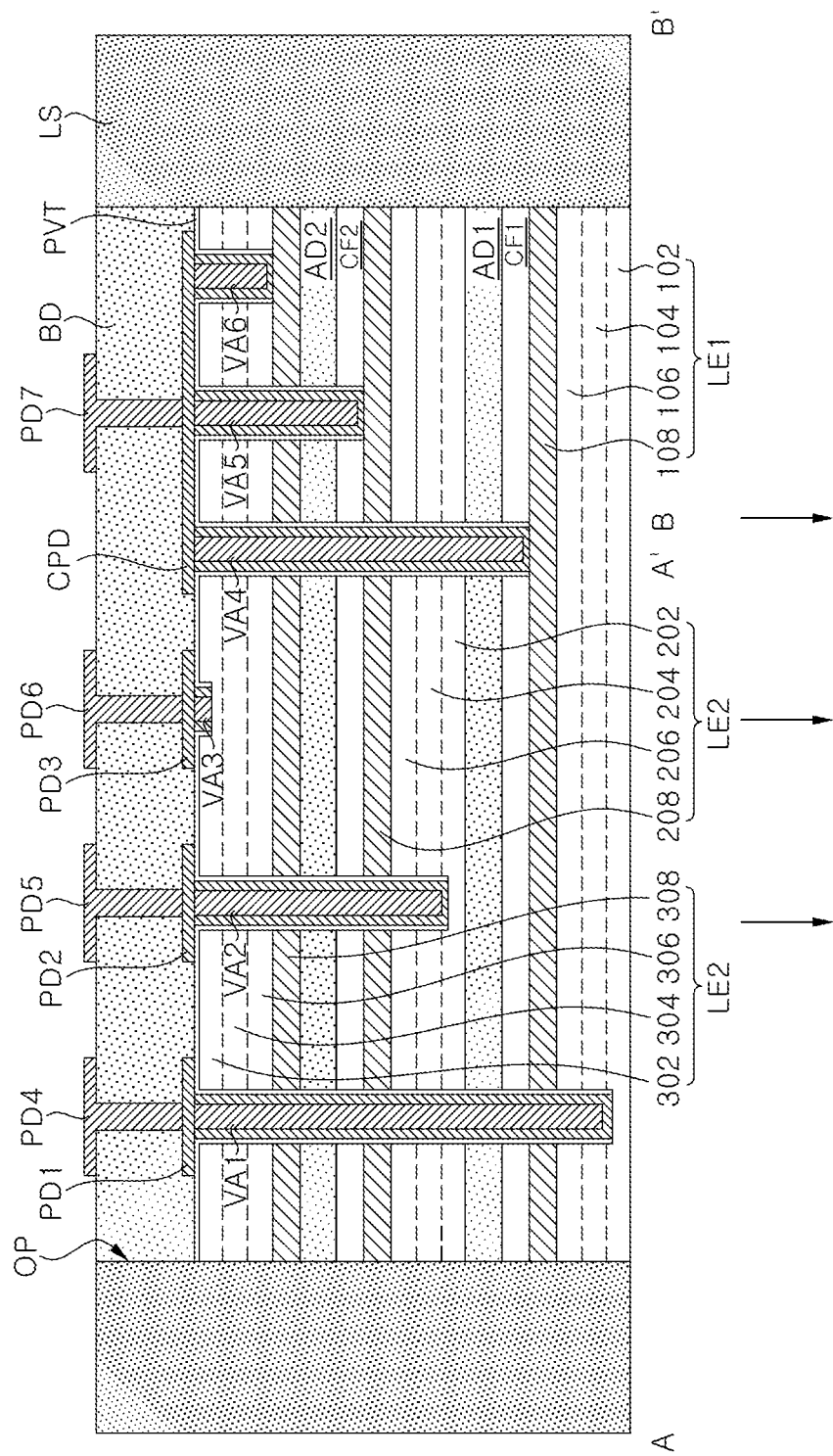
FIG. 2B is a cross-sectional view taken along lines A-A' and B-B' of FIG. 2A.
Figure 3A:
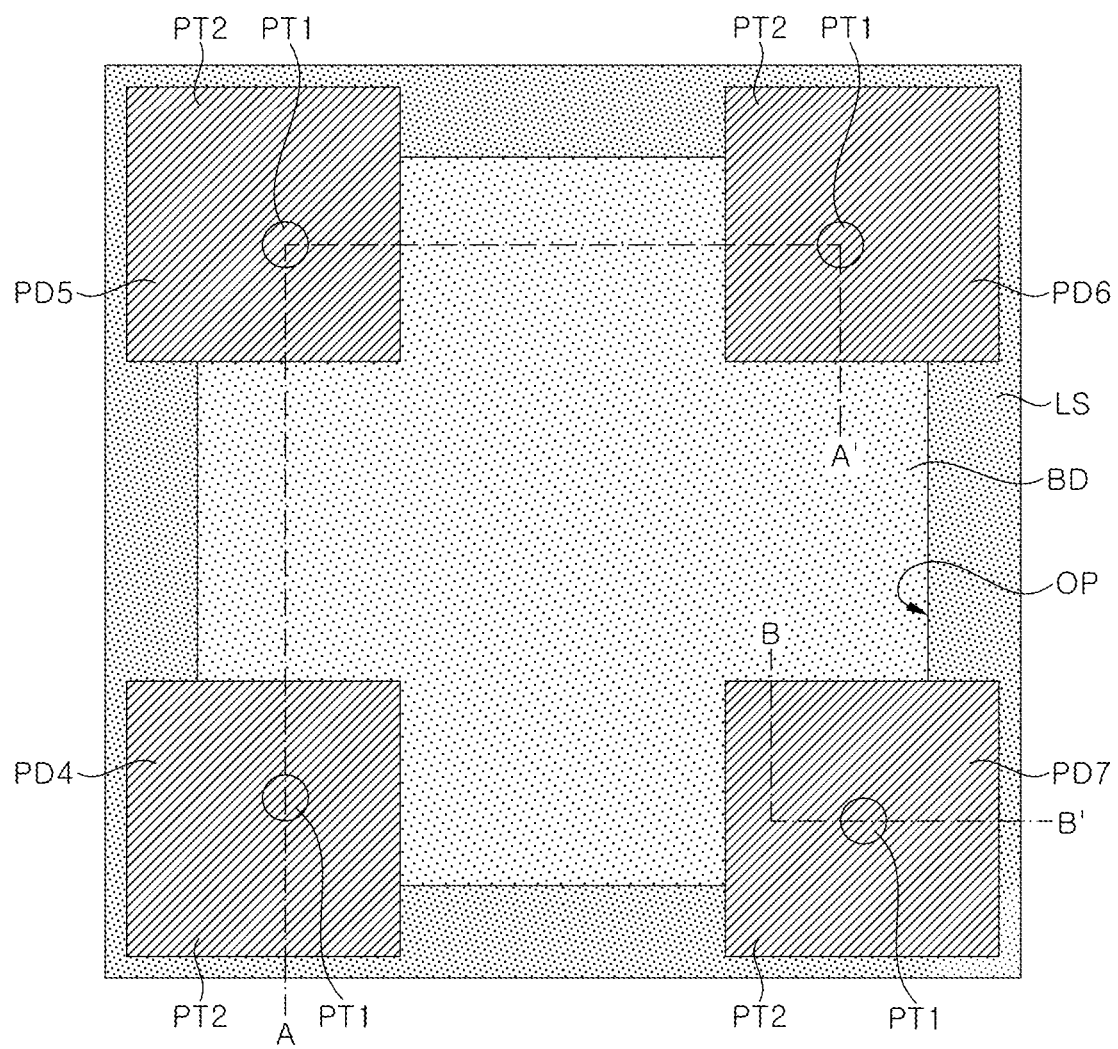
FIG. 3A is a schematic top view of a light emitting cell according to an exemplary embodiment.
Figure 3B:
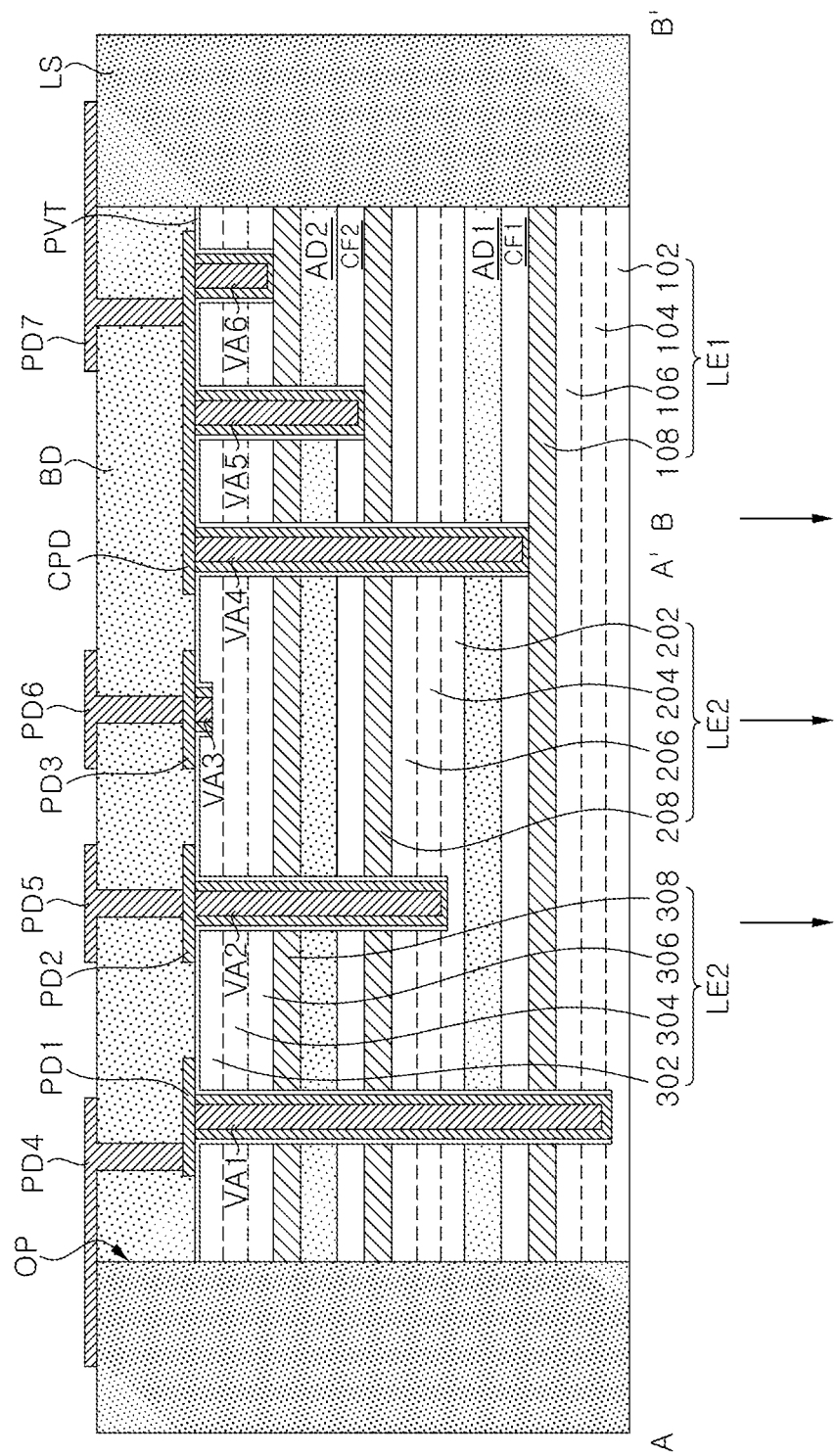
FIG. 3B is a cross-sectional view taken along lines A-A' and B-B' of FIG. 3A.
Figure 4A:
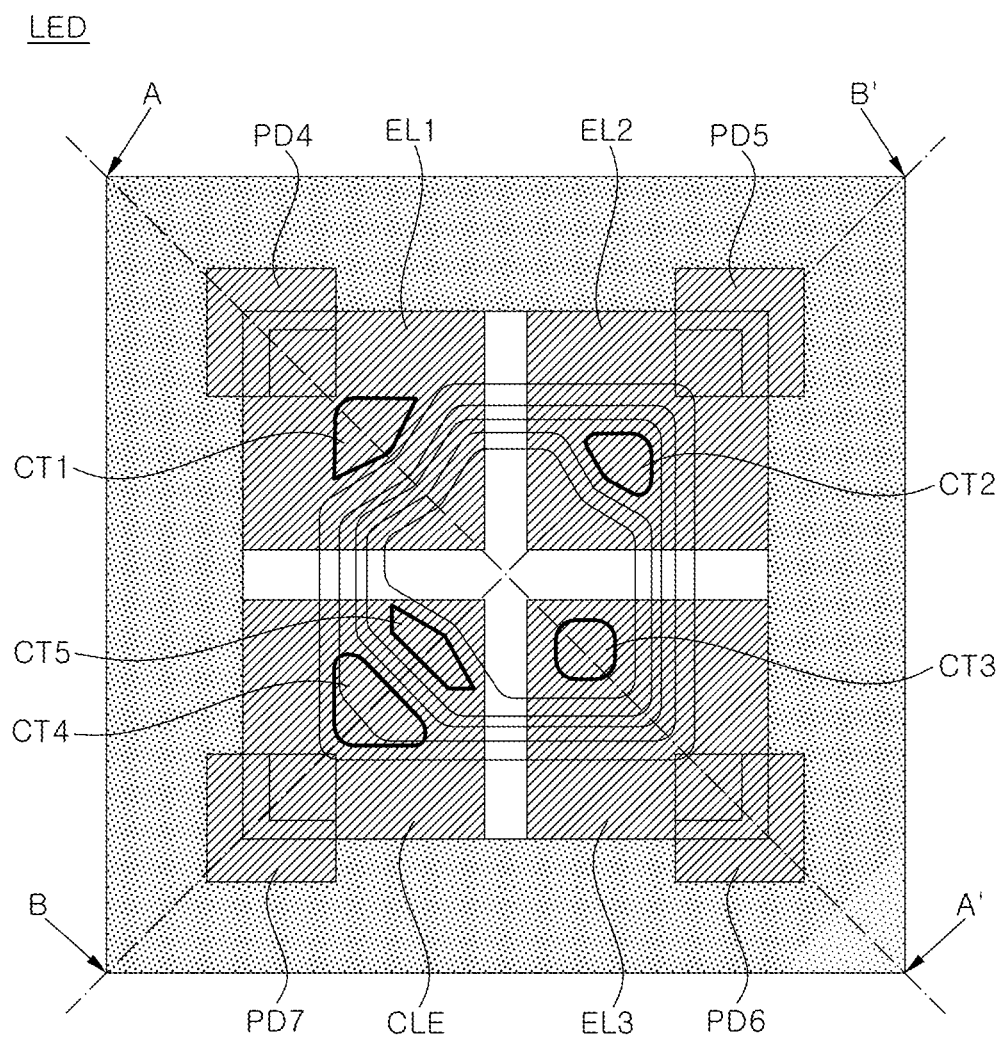
FIG. 4A is a schematic top view of a light emitting cell according to an exemplary embodiment.
Figure 4B:
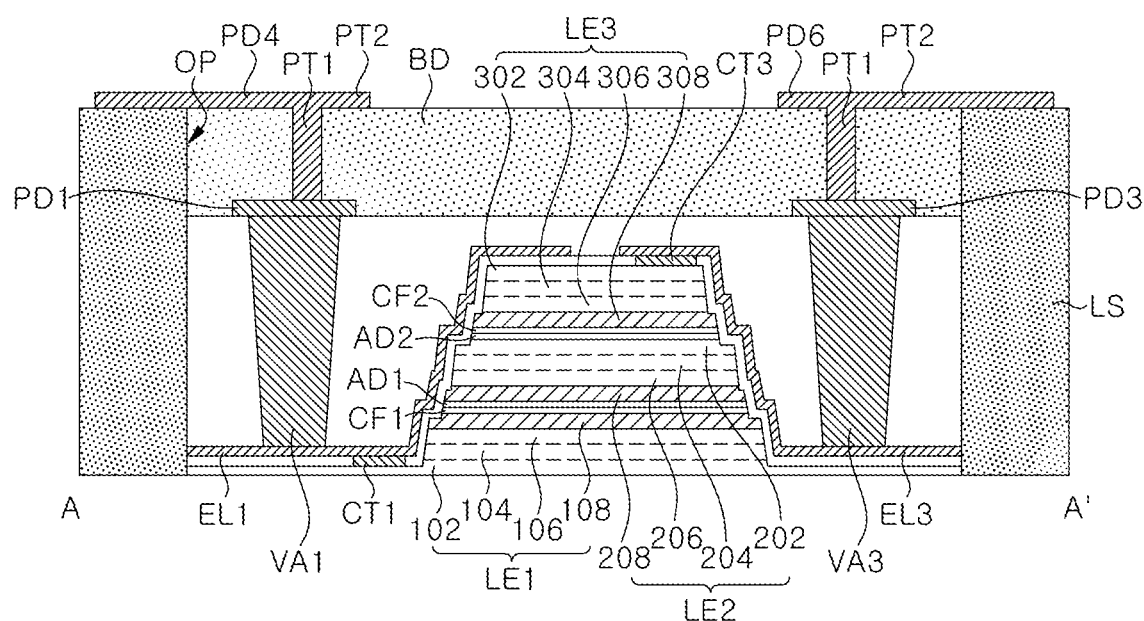
FIG. 4B is a cross-sectional view taken along line A-A' of FIG. 4A.
Figure 4C:
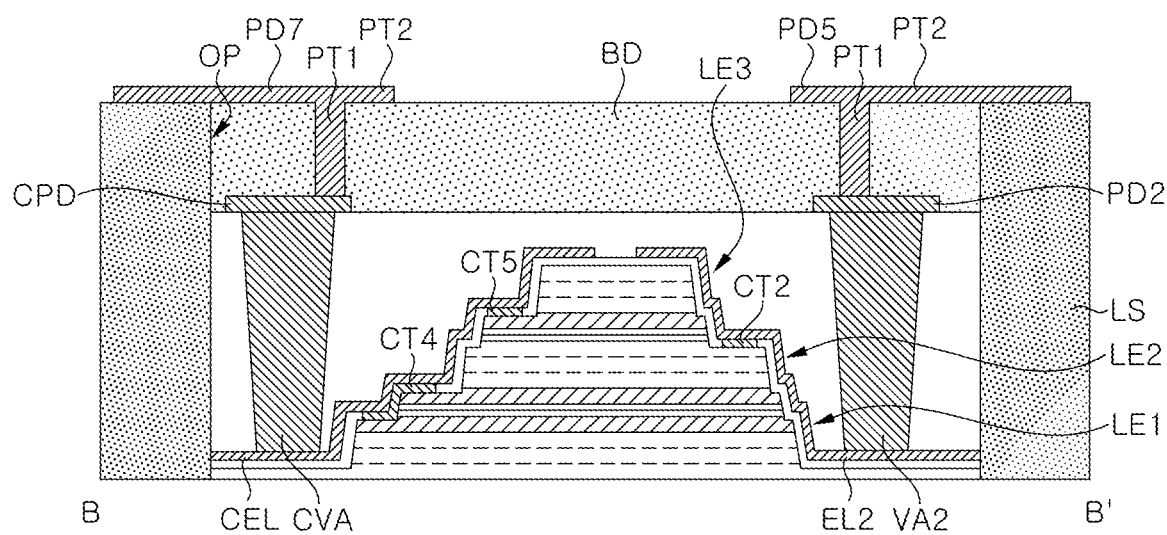
FIG. 4C is a cross-sectional view taken along line B-B' of FIG. 4A.

FIG. 2A is a schematic top view of a light emitting cell according to an exemplary embodiment, and FIG. 2B is a cross-sectional view taken along lines A-A' and B-B' of FIG. 2A. FIG. 3A is a schematic top view of a light emitting cell according to an exemplary embodiment, and FIG. 3B is a cross-sectional view taken along lines A-A' and B-B' of FIG. 3A. FIG. 4A is a schematic top view of a light emitting cell according to an exemplary embodiment, FIG. 4B is a cross-sectional view taken along line A-A' of FIG. 4A, and FIG. 4C is a cross-sectional view taken along line B-B' of FIG. 4A.

Referring to FIGS. 2A to 4C, a light emitting cell LED may include a first light emitting part LE1, a second light emitting part LE2, and a third light emitting part LE3.

According to the illustrated exemplary embodiments, the first light emitting part LE1, the second light emitting part LE2, and the third light emitting part LE3 may be vertically stacked. In some exemplary embodiments, however, at least one of the first light emitting part LE1, the second light emitting part LE2, and the third light emitting part LE3 may be horizontally disposed on the same plane.

The first light emitting part LE1 may include a first n-type semiconductor layer 102, a first active layer 104, a first p-type semiconductor layer 106, and a first ohmic layer 108. The second light emitting part LE2 may include a second n-type semiconductor layer 202, a second active layer 204, a second p-type semiconductor layer 206, and a second ohmic layer 208. The third light emitting part LE3 may include a third p-type semiconductor layer 306, a third active layer 304, a third n-type semiconductor layer 302, and a third ohmic layer 308.

Each of the first n-type semiconductor layer 102, the second n-type semiconductor layer 202, and the third n-type semiconductor layer 302 may be a Si-doped gallium nitride-based semiconductor layer. Each of the first p-type semiconductor layer 106, the second p-type semiconductor layer 206, and the third p-type semiconductor layer 306 may be a Mg-doped gallium nitride-based semiconductor layer. Each of the first active layer 104, the second active layer 204, and the third active layer 304 may include a multi-quantum well (MQW), and the composition ratio thereof may be determined to emit light of a desired peak wavelength. As each of the first ohmic layer 108, the second ohmic layer 208, and the third ohmic layer 308, a transparent conductive oxide (TCO), such as SnO, InO$_2$, ZnO or ITO (indium tin oxide) may be used.

The light emitting cell LED may further include a first pad PD1 electrically coupled with the first n-type semiconductor layer 102, a second pad PD2 electrically coupled with the second n-type semiconductor layer 202, a third pad PD3 electrically coupled with the third n-type semiconductor layer 302, and a common pad CPD electrically coupled in common with the first ohmic layer 108, the second ohmic layer 208, and the third ohmic layer 308.

While the common pad CPD is illustrated as electrically coupling the first ohmic layer 108, the second ohmic layer 208, and the third ohmic layer 308 in common, however, the inventive concepts are not limited thereto. For example, in some exemplary embodiments, the common pad CPD may electrically couple the first n-type semiconductor layer 102, the second n-type semiconductor layer 202, and the third n-type semiconductor layer 302 in common. According to an example embodiment, each of the first pad PD1, the second pad PD2, the third pad PD3, and the common pad CPD may include at least one of Au, Ag, Ni, Al, Rh, Pd, Jr, Ru, Mg, Zn, Pt, Hf, Cr, Ti, and Cu, or an alloy thereof.

When the first light emitting part LE1, the second light emitting part LE2, and the third light emitting part LE3 have substantially the same size as shown in FIGS. 2B and 3B, the first light emitting part LE1, the second light emitting part LE2, and the third light emitting part LE3 may have outer sidewalls that are coplanar with one another. The first n-type semiconductor layer 102 may be electrically coupled with the first pad PD1 by a first via structure VA1, the second n-type semiconductor layer 202 may be electrically coupled with the second pad PD2 by a second via structure VA2, the third n-type semiconductor layer 302 may be electrically coupled with the third pad PD3 by a third via structure VA3, the first ohmic layer 108 may be electrically coupled with the common pad CPD by a fourth via structure VA4, the second ohmic layer 208 may be electrically coupled with the common pad CPD by a fifth via structure VA5, and the third ohmic layer 308 may be electrically coupled with the common pad CPD by a sixth via structure VA6.

Referring to FIGS. 4A, 4B and 4C, according to another exemplary embodiment, the first light emitting part LE1 may be larger than the second light emitting part LE2, and the second light emitting part LE2 may be larger than the third light emitting part LE3. For example, when the first light emitting part LE1 includes the first n-type semiconductor layer 102, the first active layer 104, the first p-type semiconductor layer 106, and the first ohmic layer 108, which are sequentially stacked, the second light emitting part LE2 includes the second ohmic layer 208, the second p-type semiconductor layer 206, the second active layer 204, and the second n-type semiconductor layer 202, which are sequentially stacked, and the third light emitting part LE3 includes the third ohmic layer 308, the third p-type semiconductor layer 306, the third active layer 304, and the third n-type semiconductor layer 302, which are sequentially stacked, the first light emitting part LE1, the second light emitting part LE2, and the third light emitting part LE3 may be etched, such that each of the first n-type semiconductor layer 102 and the first ohmic layer 108 of the first light emitting part LE1 is exposed by the second light emitting part LE2 and the third light emitting part LE3, each of the second n-type semiconductor layer 202 and the second ohmic layer 208 of the second light emitting part LE2 is exposed by the third light emitting part LE3, and the third ohmic layer 308 of the third light emitting part LE3 is exposed by the third p-type semiconductor layer 306, the third active layer 304, and the third n-type semiconductor layer 302. The first n-type semiconductor layer 102 may be electrically coupled with the first pad PD1 by a first contact pattern CT1 and a first extended pattern EL1, the second n-type semiconductor layer 202 may be electrically coupled with the second pad PD2 by a second contact pattern CT2 and a second extended pattern EL2, and the third n-type semiconductor layer 302 may be electrically coupled with the third pad PD3 by a third contact pattern CT3 and a third extended pattern EL3. The first ohmic layer 108 and the second ohmic layer 208 may be electrically coupled with the common pad CPD by a fourth contact pattern CT4 and a common extended pattern CEL, and the third ohmic layer 308 may be electrically coupled with the common pad CPD by a fifth contact pattern CT5 and the common extended pattern CEL. Each of the first extended pattern EL1, the second extended pattern EL2, the third extended pattern EL3, and the common extended pattern CEL may extend onto the top of the exposed first n-type semiconductor layer 102, and thus, may have substantially a flat top surface. The first extended pattern EL1 may be electrically coupled with the first pad PD1 by a first via structure VA1, the second extended pattern EL2 may be electrically coupled with the second pad PD2 by a second via structure VA2, the third extended pattern EL3 may be electrically coupled with the third pad PD3 by a third via structure VA3, and the common extended pattern CEL may be electrically coupled with the common pad CPD by a common via structure CVA. The first via structure VA1, the second via structure VA2, the third via structure VA3, and the common via structure CVA may be formed to the same height from a flat portion, and thus, may be electrically coupled with the first pad PD1, the second pad PD2, the third pad PD3, and the common pad CPD more stably, respectively. In some exemplary embodiments, the first extended pattern EL1, the second extended pattern EL2, the third extended pattern EL3, and the common extended pattern CEL may be selectively omitted.

Referring to FIGS. 2A to 4C, the light emitting cell LED may further include a first adhesion part AD1, which bonds the first light emitting part LE1 and the second light emitting part LE2 between the first light emitting part LE1 and the second light emitting part LE2, and a second adhesion part AD2, which bonds the second light emitting part LE2 and the third light emitting part LE3 between the second light emitting part LE2 and the third light emitting part LE3. Each of the first adhesion part AD1 and the second adhesion part AD2 may include a material, which has an insulation property, transmitting visible light, and a bonding characteristic. Each of the first adhesion part AD1 and the second adhesion part AD2 may include glass, a polymer, a resist, or a polyimide. For example, each of the first adhesion part AD1 and the second adhesion part AD2 may include SOG, BCB, HSQ, or a SU-8 photoresist.

According to an exemplary embodiment, the light emitting cell LED may further include a first color filter CF1 disposed between the first light emitting part LE1 and the second light emitting part LE2, and a second color filter CF2 disposed between the second light emitting part LE2 and the third light emitting part LE3. The first color filter CF1 may reflect light generated from the first light emitting part LE1 while passing light generated from the second light emitting part LE2 and the third light emitting part LE3 therethrough, so that light generated from the first light emitting part LE1 does not exert an influence on each of the second light emitting part LE2 and the third light emitting part LE3. The second color filter CF2 may reflect light generated from each of the first light emitting part LE1 and the second light emitting part LE2 while passing light generated from the third light emitting part LE3 therethrough, so that light generated from the first light emitting part LE1 and the second light emitting part LE2 does not exert an influence on the third light emitting part LE3. Each of the first color filter CF1 and the second color filter CF2 may include a DBR (distributed Bragg reflector) having a structure, in which $TiO_2$ and $SiO_2$ are alternately stacked. For example, the alternation sequence or number of $TiO_2$ and $SiO_2$ in the second color filter CF2 may be different from the alternation sequence or number of $TiO_2$ and $SiO_2$ in the first color filter CF1.

The light emitting cell LED may further include a light shielding layer LS, which surrounds the outer sidewall of each of the first light emitting part LE1, the second light emitting part LE2, and the third light emitting part LE3. The light shielding layer LS may include an opening OP, which exposes one surface of the first light emitting part LE1. As described above with reference to FIGS. 1A, 1B, and 1C, the light shielding layer LS may include a material, which has an insulation property and a light shielding characteristic. For example, the light shielding layer LS may include a material, such as a photoresist and a black matrix.

The light emitting cell LED may further include a bonding part BD, which covers the first pad PD1, the second pad PD2, the third pad PD3, and the common pad CPD over the third light emitting part LE3, and fills the opening OP of the light shielding layer LS. According to an exemplary embodiment, the bonding part BD may include a polymer. For example, the bonding part BD may include at least one of a photoresist, epoxy, BCB, Flare™ MSSQ, PMMA, PDMS, fluoropolymer, a polyimide, MSSQ, PEEK, ATSP, PVDC, LCP, and a wax. For example, each of the bonding parts BD may include a thermosetting polymer, which is cured at a temperature of about 100° C. to about 300° C.

According to an exemplary embodiment, the top surface of the bonding part BD may be substantially coplanar with one surface of the light shielding layer LS. The other, opposing surface of the light shielding layer LS may be coplanar with one surface of the first light emitting part LE1.

The light emitting cell LED may further include a fourth pad PD4, a fifth pad PD5, a sixth pad PD6, and a seventh pad PD7, which pass through the bonding part BD and are electrically coupled with the first pad PD1, the second pad PD2, the third pad PD3, and the common pad CPD, respectively. Each of the fourth pad PD4, the fifth pad PD5, the sixth pad PD6, and the seventh pad PD7 may include at least one of Au, Ag, Ni, Al, Rh, Pd, Jr, Ru, Mg, Zn, Pt, Hf, Cr, Ti, and Cu, or an alloy thereof.

Each of the fourth pad PD4, the fifth pad PD5, the sixth pad PD6, and the seventh pad PD7 may include a first portion PT1, which is disposed in the bonding part BD, and a second portion PT2, which extends from the first portion PT1 onto one surface of the bonding part BD. According to an exemplary embodiment, the dispositions and extending lengths of the fourth pad PD4, the fifth pad PD5, the sixth pad PD6, and the seventh pad PD7 may be changed depending on an apparatus to which the light emitting cell LED is to be mounted. In this manner, a light emitting device including light emitting cells LED may be applied to various electronic apparatuses.

According to the illustrated exemplary embodiment of FIGS. 2A and 2B, the second portion PT2 of each of the fourth pad PD4, the fifth pad PD5, the sixth pad PD6, and the seventh pad PD7 may extend within the bonding part BD. According to the other exemplary embodiments of FIGS. 3A, 3B, 4A, and 4B, the second portion PT2 of each of the fourth pad PD4, the fifth pad PD5, the sixth pad PD6, and the seventh pad PD7 may extend to not only the bonding part BD but also to the light shielding layer LS. In this manner, the dispositions and extending lengths of the fourth pad PD4, the fifth pad PD5, the sixth pad PD6, and the seventh pad PD7 may be changed depending on an apparatus to which the light emitting cell LED is to be mounted.

Hereafter, a method for manufacturing the light emitting device shown in FIGS. 1A and 1B will be described.

FIGS. 5A, 5B, and 6A to 18A are top views illustrating a method for manufacturing a light emitting device according to an exemplary embodiment, and FIGS. 5C, 6B to 18B are cross-sectional views taken along line A-A' of a corresponding top view of FIGS. 5B, 6A to 18A. FIG. 5B is an enlarged top view of B of FIG. 5A.

Figure 5A:
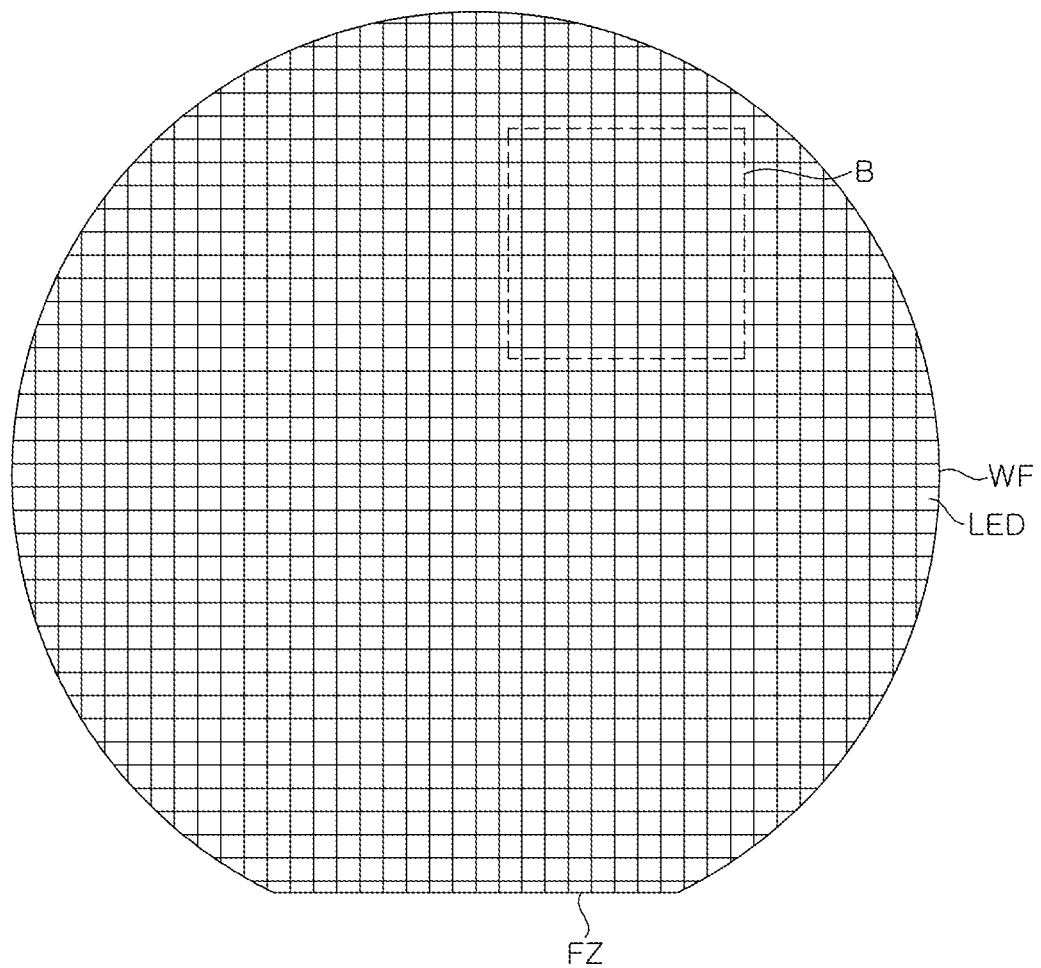
FIGS. 5A and 5B are top views illustrating a method for manufacturing a light emitting device according to an exemplary embodiment.
Figure 5B:
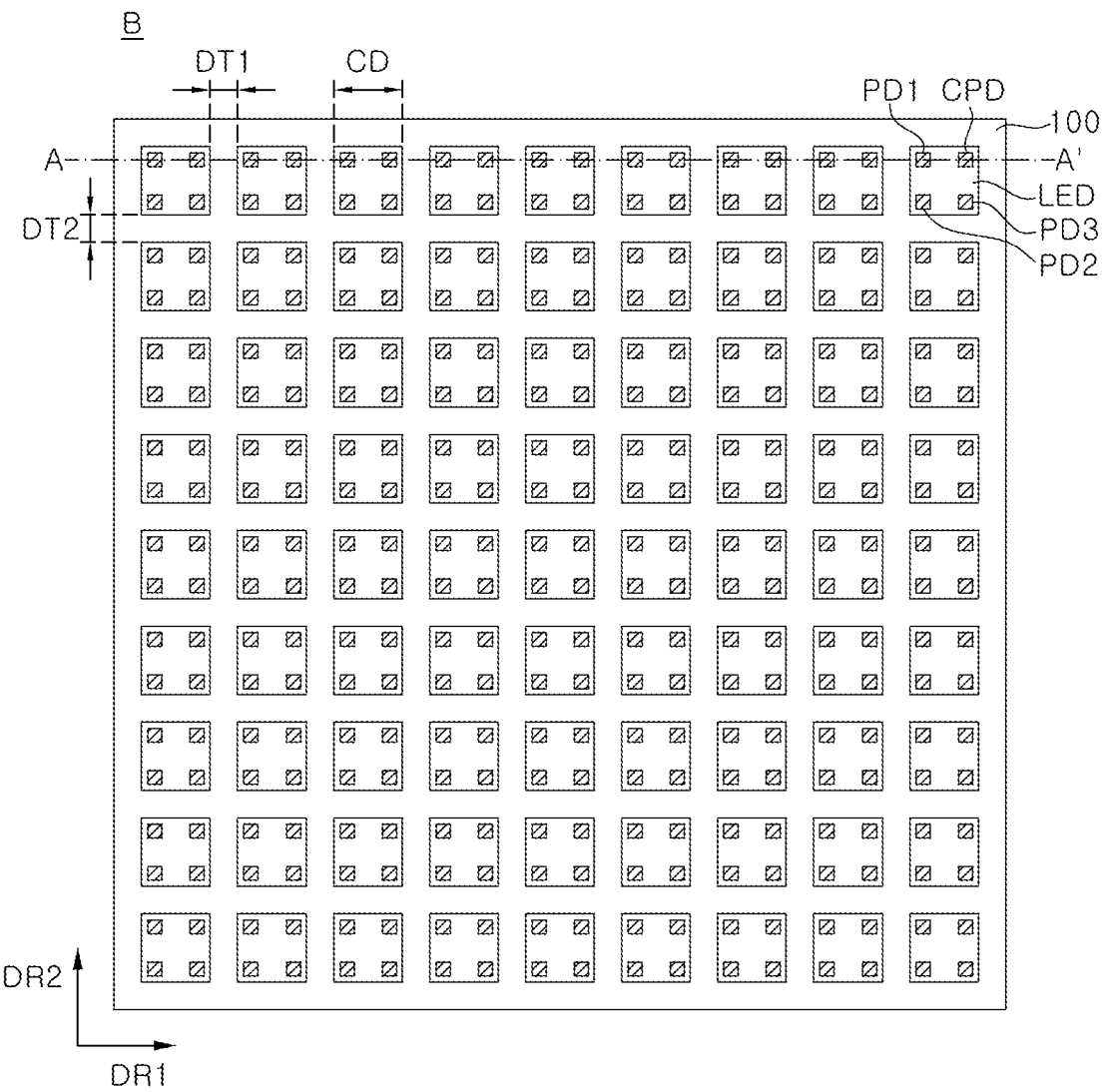
Figure 5C:
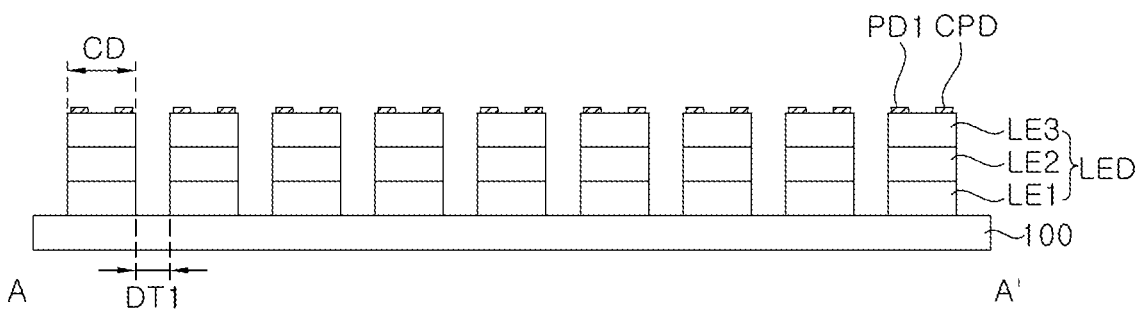
FIG. 5C is a cross-sectional view taken along line A-A' of FIG. 5B.

Referring to FIGS. 5A, 5B, and 5C, a plurality of light emitting cells LED each including a first light emitting part LE1, a second light emitting part LE2, and a third light emitting part LE3 may be formed on a first substrate 100.

The first substrate 100 may be capable of growing a gallium nitride-based semiconductor layer thereon, an may include a sapphire ($Al_2O_3$), a silicon carbide (SiC), a gallium nitride (GaN), an indium gallium nitride (InGaN), an aluminum gallium nitride (AlGaN), an aluminum nitride (AlN), a gallium oxide ($Ga_2O_3$), a gallium arsenic (GaAs), or silicon. Also, the substrate 100 may be a flexible substrate or a substrate including a circuit therein.

According to the illustrated exemplary embodiment of FIG. 5A, the first substrate 100 may use a circular wafer WF having a flat zone FZ. However, the inventive concepts are not limited thereto, and in some exemplary embodiments, the first substrate 100 may use a circular wafer having a notch or a quadrangular wafer.

By sequentially forming a first n-type semiconductor layer 102, a first active layer 104, and a first p-type semiconductor layer 106 on the first substrate 100 by using a growing method, such as MOCVD (metal organic chemical vapor deposition), MBE (molecular beam epitaxy), HVPE (hydride vapor phase epitaxy), and MOC (metal-organic chloride), and by forming a first ohmic layer 108 on the first p-type semiconductor layer 106 through a chemical vapor deposition (CVD) or a physical vapor deposition (PVD) process, the first light emitting part LE1 may be formed. By sequentially forming a second n-type semiconductor layer, a second active layer 204, and a second p-type semiconductor layer 206 on a second substrate by using a growing method, such as MOCVD, MBE, HVPE, and MOC, and by forming a second ohmic layer 208 on the second p-type semiconductor layer 206 through a CVD or a PVD process, the second light emitting part LE2 may be formed. By sequentially forming a third n-type semiconductor layer 302, a third active layer 304, and a third p-type semiconductor layer 306 on a third substrate by using a growing method, such as MOCVD, MBE, HVPE, and MOC, and by forming a third ohmic layer 308 on the third p-type semiconductor layer 306 through a CVD or a PVD process, the third light emitting part LE3 may be formed.

The second light emitting part LE2 may be bonded onto the first light emitting part LE1 by using a first adhesion part AD1, and the second substrate may be removed by a laser lift-off (LLO) process, for example. The third light emitting part LE3 may be bonded onto the second light emitting part LE2 by using a second adhesion part AD2, and the third substrate may be removed by an laser lift-off (LLO) or a chemical lift-off (CLO) process, for example.

As described above with reference to FIGS. 2A and 2B, by forming via holes in the first light emitting part LE1, the second light emitting part LE2, and the third light emitting part LE3, a first via structure VA1 electrically coupled with the first n-type semiconductor layer 102, a second via structure VA2 electrically coupled with the second n-type semiconductor layer 202, a third via structure VA3 electrically coupled with the third n-type semiconductor layer 302, a fourth via structure VA4 electrically coupled with the first ohmic layer 108, a fifth via structure VA5 electrically coupled with the second ohmic layer 208, and a sixth via structure VA6 electrically coupled with the third ohmic layer 308 may be formed. Then, a first pad PD1 electrically coupled with the first via structure VA1, a second pad PD2 electrically coupled with the second via structure VA2, a third pad PD3 electrically coupled with the third via structure VA3, and a common pad CPD electrically coupled in common with the fourth via structure VA4, the fifth via structure VA5, and the sixth via structure VA6 may be respectively formed.

The light emitting cells LED may be separated by a first distance DT1 in a first direction DR1 and may be separated by a second distance DT2 in a second direction DR2. For example, the first distance DT1 and the second distance DT2 may be substantially the same.

Hereinafter, the light emitting cells according to an exemplary embodiment will be described as having 9×9 arrangement as shown in FIG. 5B.

Figure 6A:
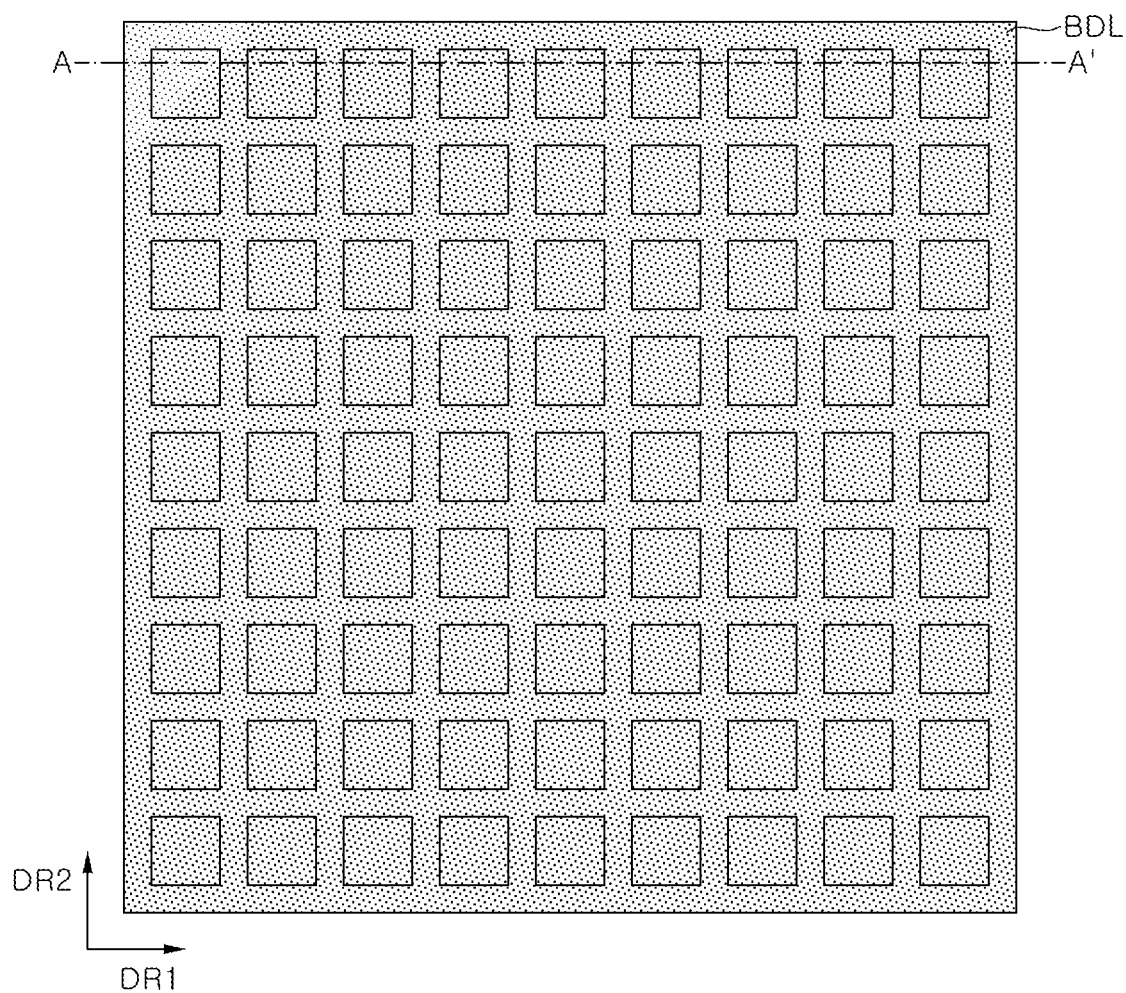
FIGS. 6A, 7A, 8A, 9A, 10A, 11A, 12A, 13A, 14A, 15A, 16A, 17A, and 18A are top views illustrating a method for manufacturing a light emitting device according to an exemplary embodiment.
Figure 6B:
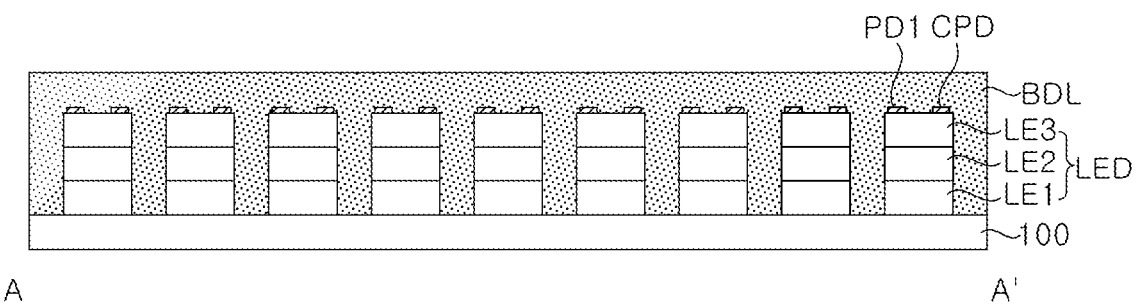
FIGS. 6B, 7B, 8B, 9B, 10B, 11B, 12B, 13B, 14B, 15B, 16B, 17B, and 18B are cross-sectional views taken along line A-A' of corresponding top views illustrated in FIGS. 6A to 18A.

Referring to FIGS. 6A and 6B, a bonding layer BDL covering the light emitting cells LED may be formed on the first substrate 100, on which the plurality of light emitting cells LED are formed. The bonding layer BDL may be formed to cover the first pad PD1, the second pad PD2, the third pad PD3, and the common pad CPD of each of the light emitting cells LED.

According to an exemplary embodiment, the bonding layer BDL may include a first polymer. For example, the bonding layer BDL may include at least one of a photoresist, epoxy, BCB, Flare™, MSSQ, PMMA, PDMS, fluoropolymer, a polyimide, MSSQ, PEEK, ATSP, PVDC, LCP, and a wax. For example, each of the bonding units BD may include a thermosetting polymer, which is cured at a temperature of about 100° C. to about 300° C. As another example, the bonding layer BDL may have an attachable/detachable characteristic.

Figure 7A:
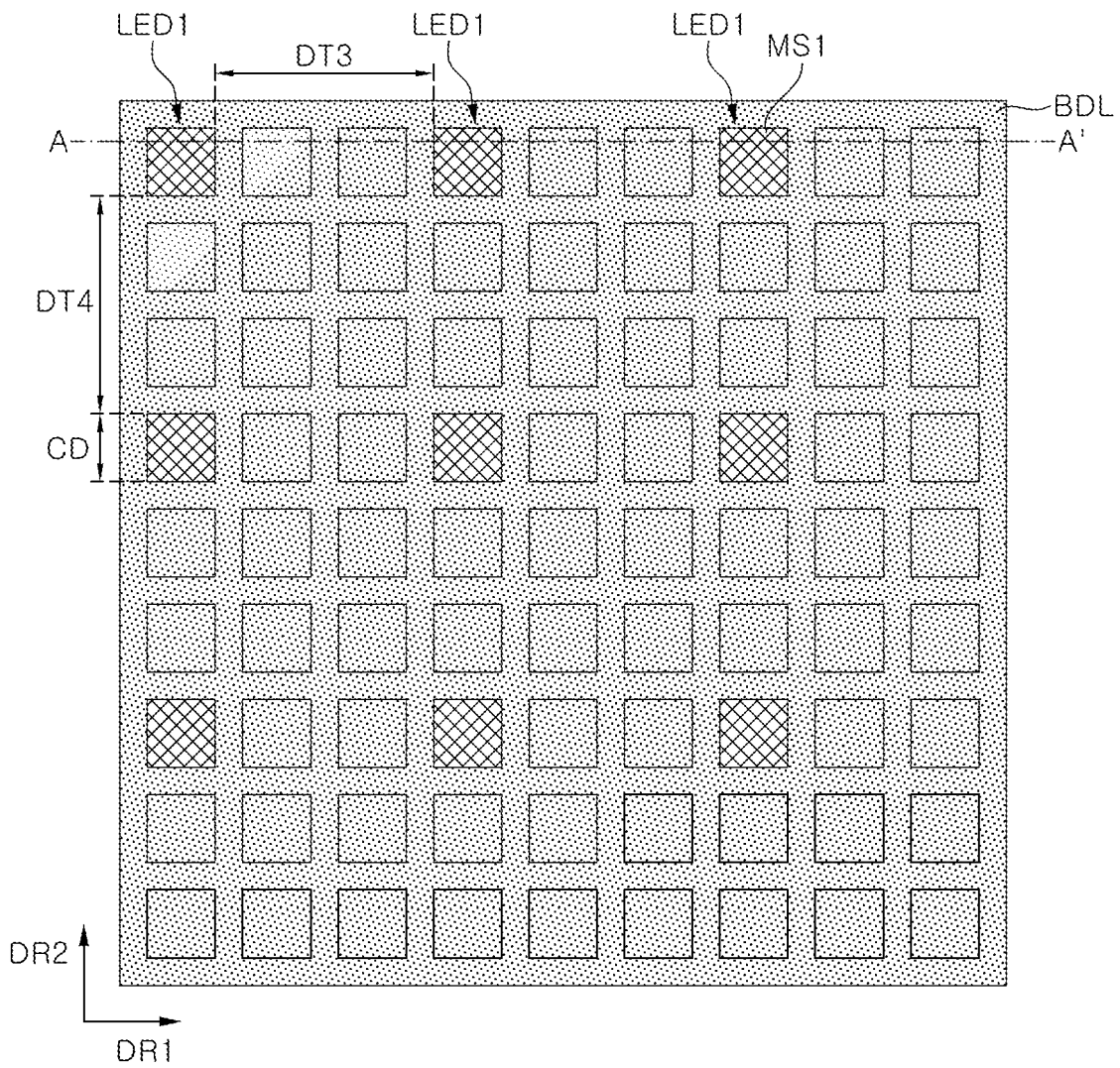
Figure 7B:
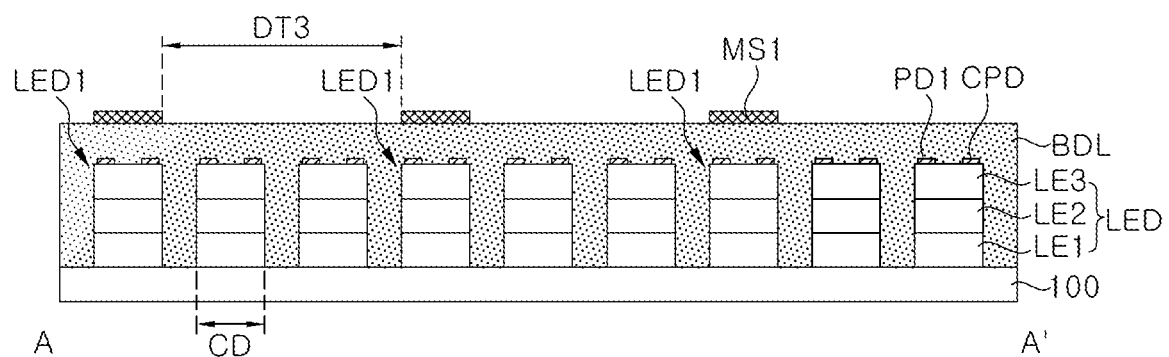

Referring to FIGS. 7A and 7B, a first mask pattern MS1, which selectively covers target light emitting cells LED may be formed on the bonding layer BDL.

The light emitting cells LED to be masked by the first mask pattern MS1 may be adjusted to be in a desired separation distance, so as to be suitable for an apparatus to which the light emitting cells LED are to be finally mounted. For example, two neighboring light emitting cells LED in the first direction DR1 masked by the first mask pattern MS1 may be spaced apart by a third distance DT3 larger than the first distance DT1 (see FIG. 5B). Two neighboring light emitting cells LED in the second direction DR2 masked by the first mask pattern MS1 may be spaced apart by a fourth distance DT4 larger than the second distance DT2 (see FIG. 5B). In some exemplary embodiments, the third distance DT3 and the fourth distance DT4 may be the same with each other. According to an exemplary embodiment, each of the third distance DT3 and the fourth distance DT4 may be about 8 to about 15 times the critical dimension (CD) of each of the masked light emitting cells LED.

According to the illustrated exemplary embodiment, a separation distance is described as being adjusted by not selecting two light emitting cells LED between the light emitting cells LED masked by the first mask pattern MS1 in the first direction DR1 and the second direction DR2. However, the inventive concepts are not limited thereto.

Hereinafter, the light emitting cells LED which are masked by the first mask pattern MS1 are referred to as first light emitting cells LED1.

Figure 8A:
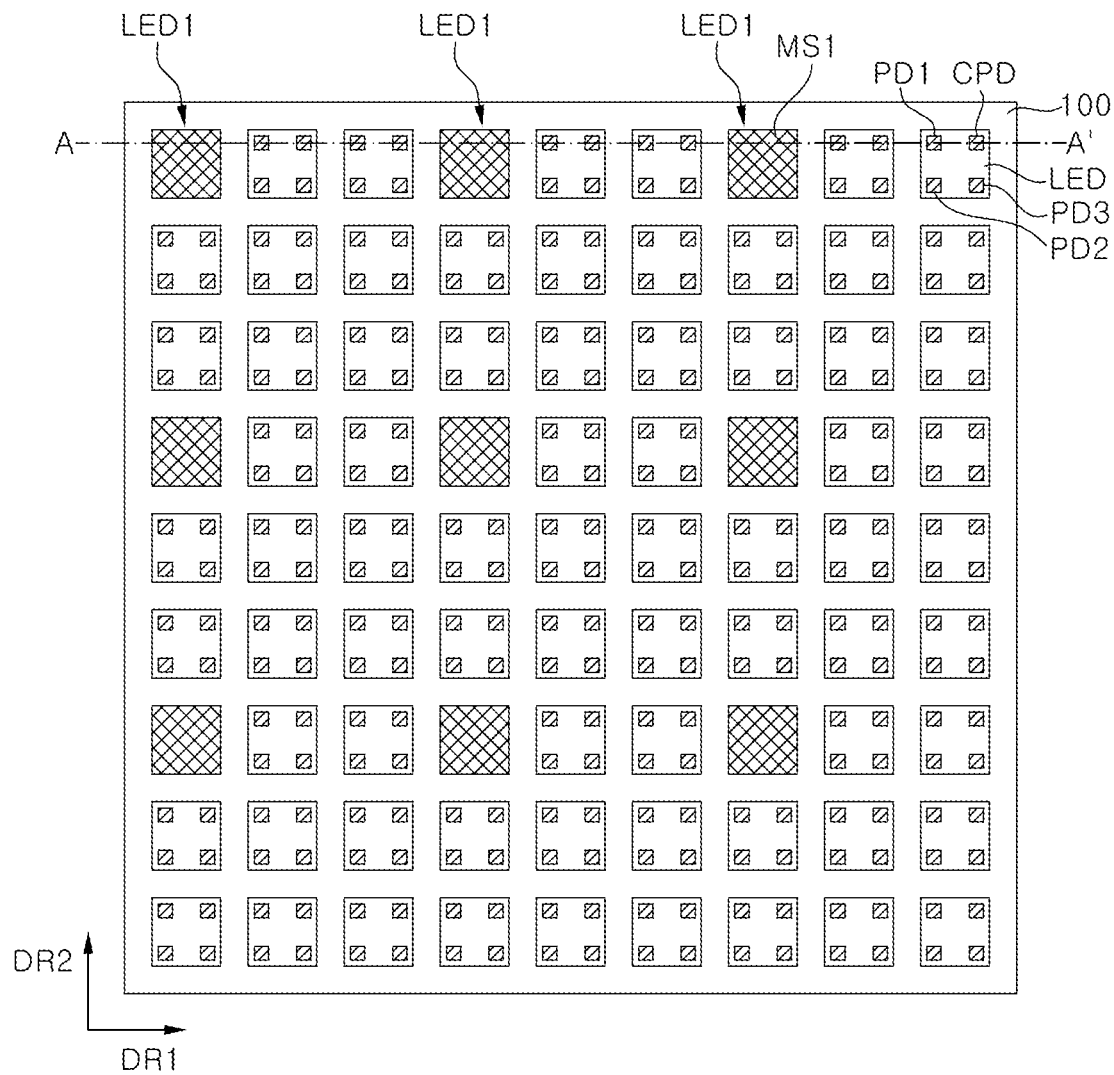
Figure 8B:
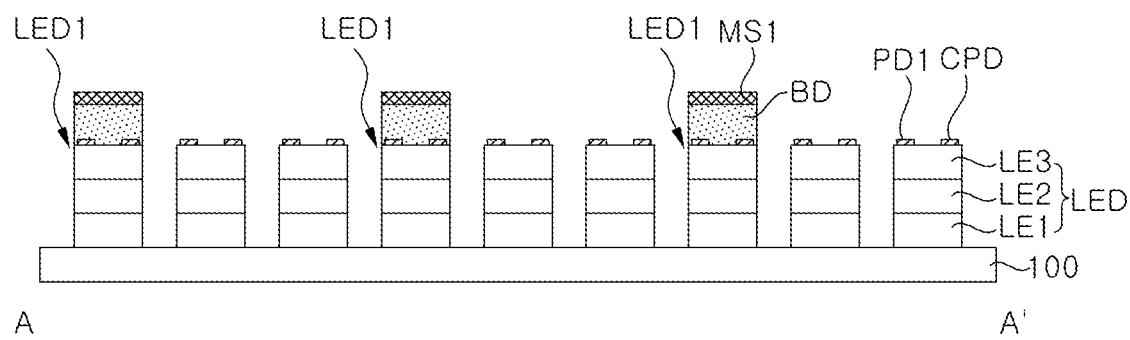
Figure 9A:
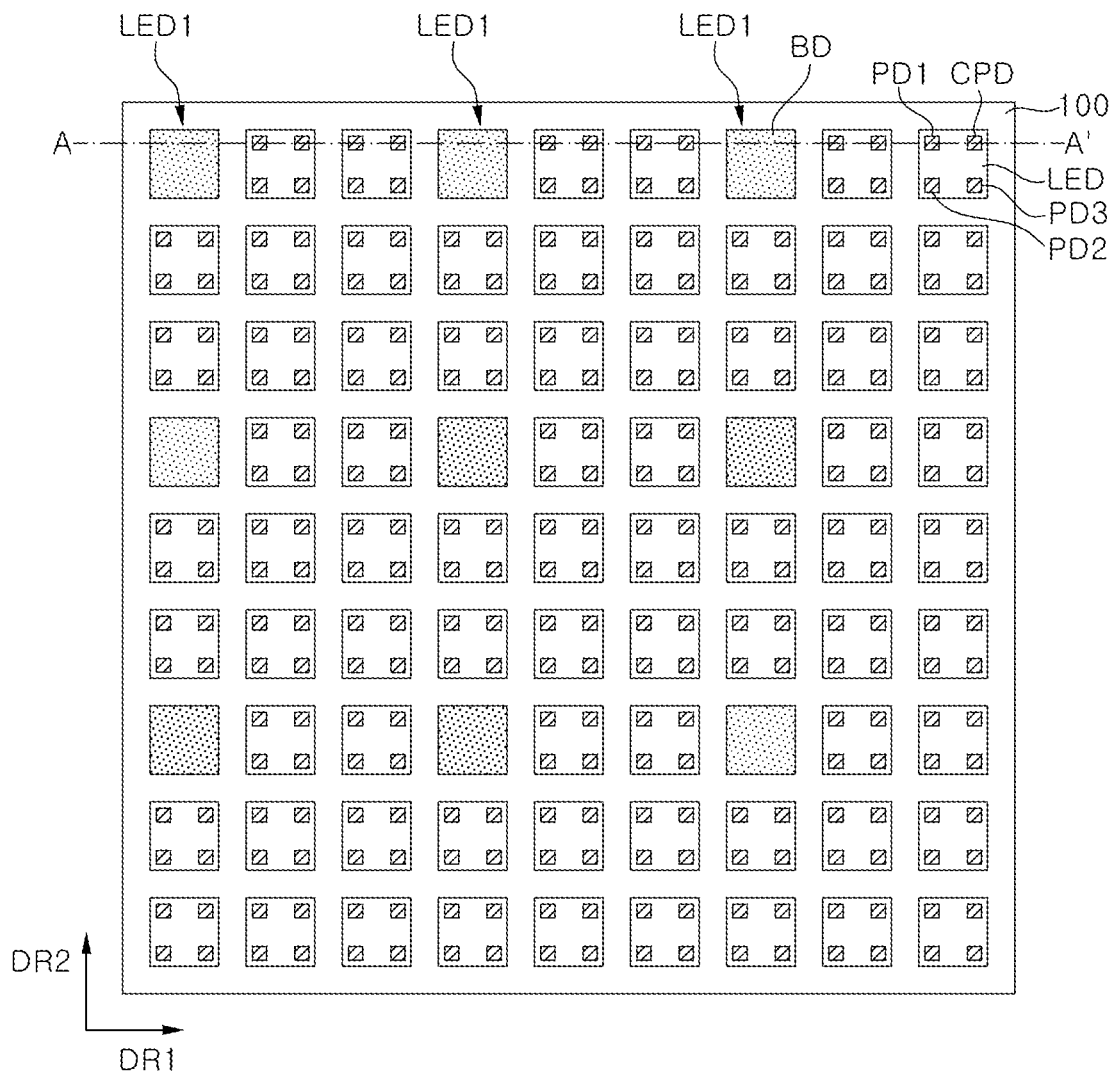
Figure 9B:
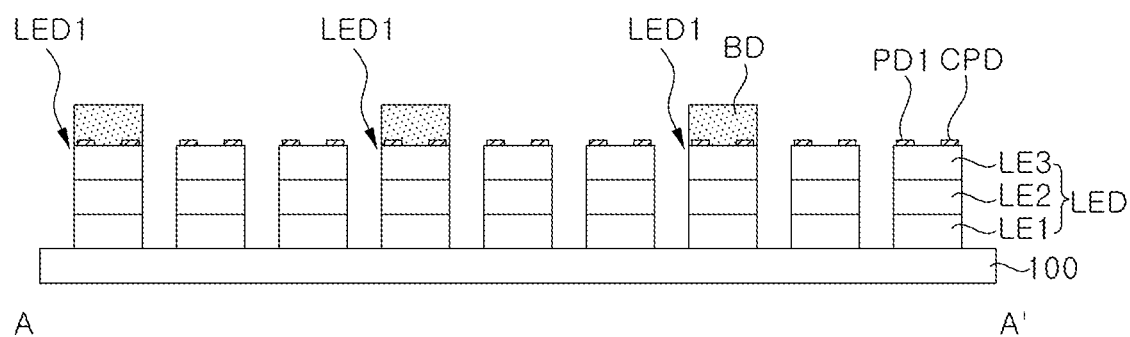

Referring to FIGS. 8A and 8B, by etching the bonding layer BDL through using the first mask pattern MS1 as an etch mask, bonding parts BD may be formed on the first light emitting cells LED1. Referring to FIGS. 9A and 9B, after forming the bonding parts BD, the first mask pattern MS1 may be removed.

Figure 10A:
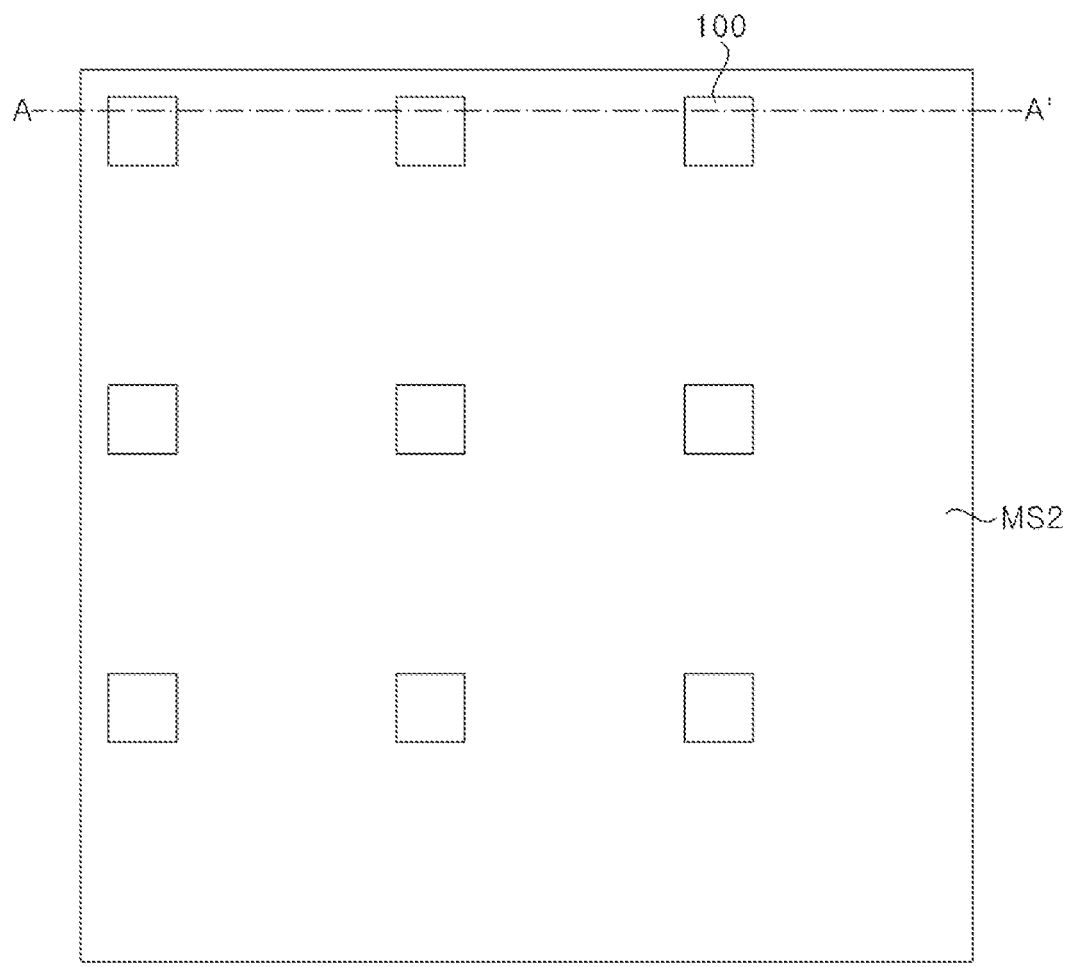
Figure 10B:
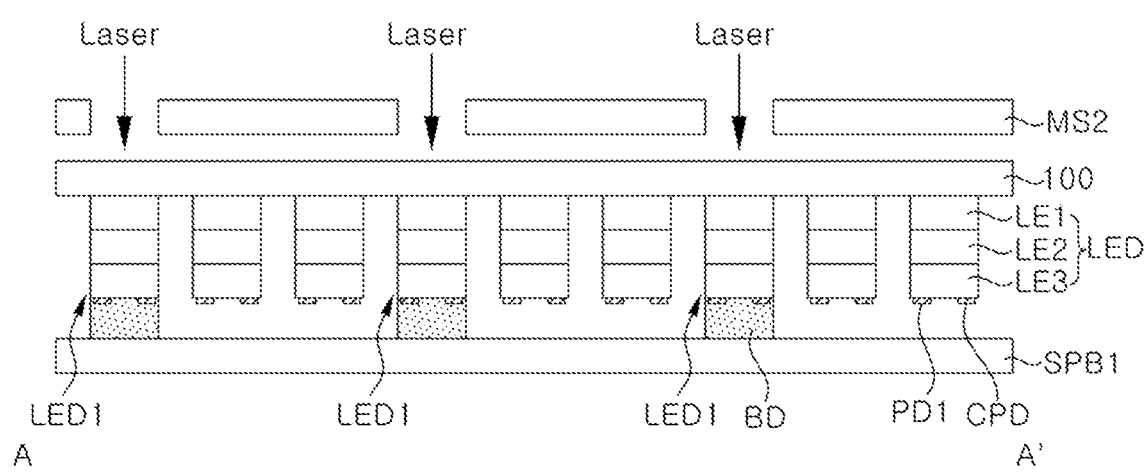

Referring to FIGS. 10A and 10B, the first substrate 100, on which the first light emitting cells LED1 formed with the bonding parts BD and the other light emitting cells LED are formed, may be turned over, such that the first light emitting cells LED1 formed with the bonding parts BD and the other light emitting cells LED face a first support substrate SPB1.

The first support substrate SPB1 may be a substrate, which temporarily supports the light emitting cells LED. As such, the type and structure of the first support substrate SPB1 are not particularly limited.

The first support substrate SPB1 may face the bonding parts BD formed on the first light emitting cells LED1 and the other light emitting cells LED. A second mask pattern MS2 may be disposed on the first substrate 100. The second mask pattern MS2 may include openings, which expose portions of the first substrate 100 that correspond to the first light emitting cells LED1 formed with the bonding parts BD. By performing a selective laser lift-off (LLO) process through the openings of the second mask pattern MS2, the first light emitting cells LED1 formed with the bonding parts BD may be selectively separated from the first substrate 100. In this manner, the first light emitting cells LED1 formed with the bonding parts BD may be separated from the first substrate 100 and bonded onto the first support substrate SPB1 by the bonding parts BD.

Figure 11A:
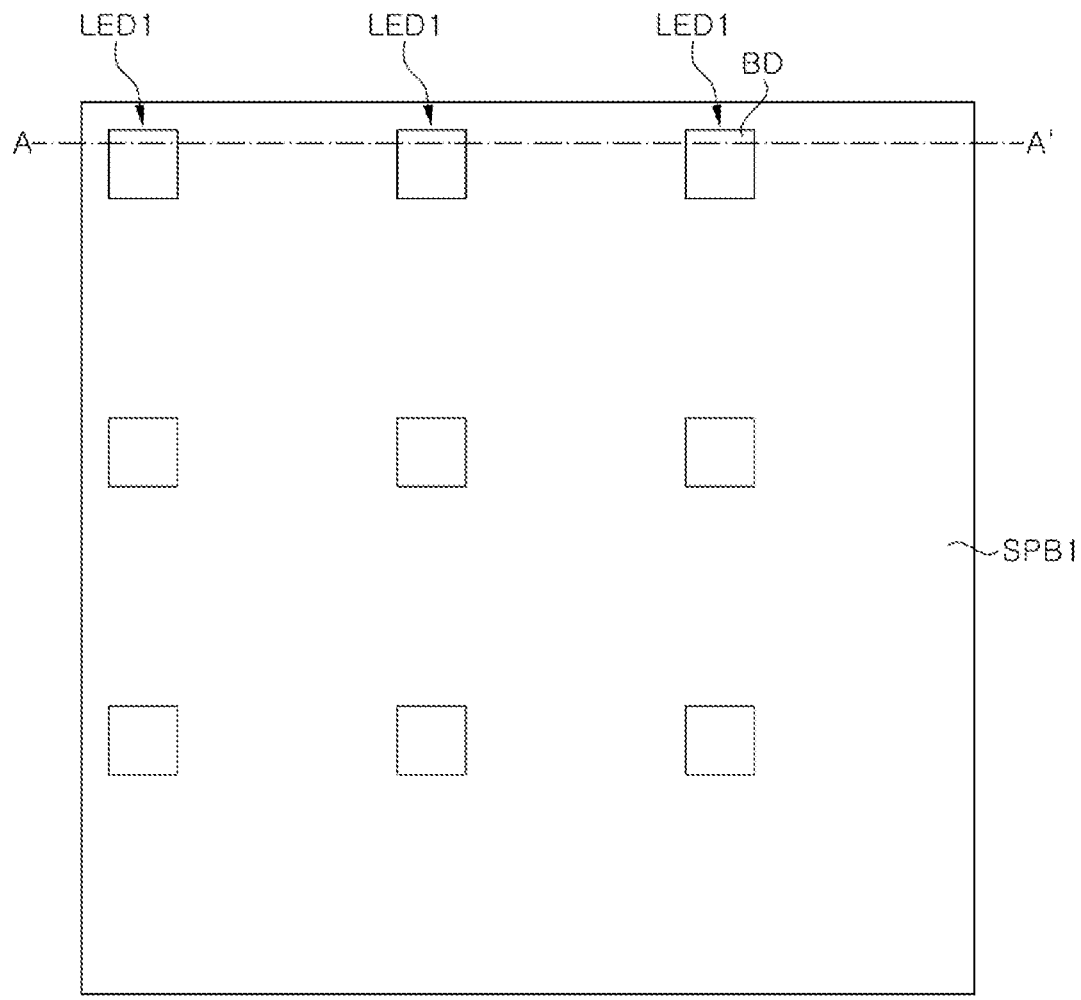
Figure 11B:
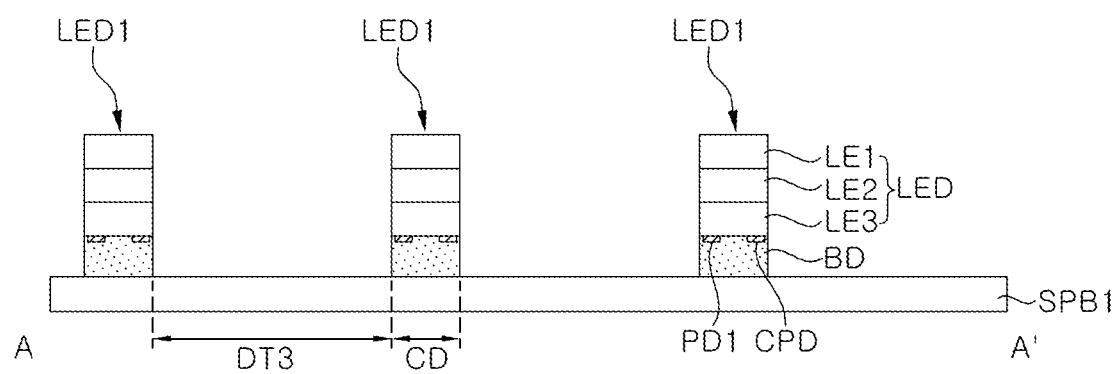

Referring to FIGS. 11A and 11B, the first light emitting cells LED1 may be disposed on the first support substrate SPB1 while being separated from one another by the third distance DT3 in the first direction DR1 and by the fourth distance DT4 in the second direction DR2.

Figure 12A:
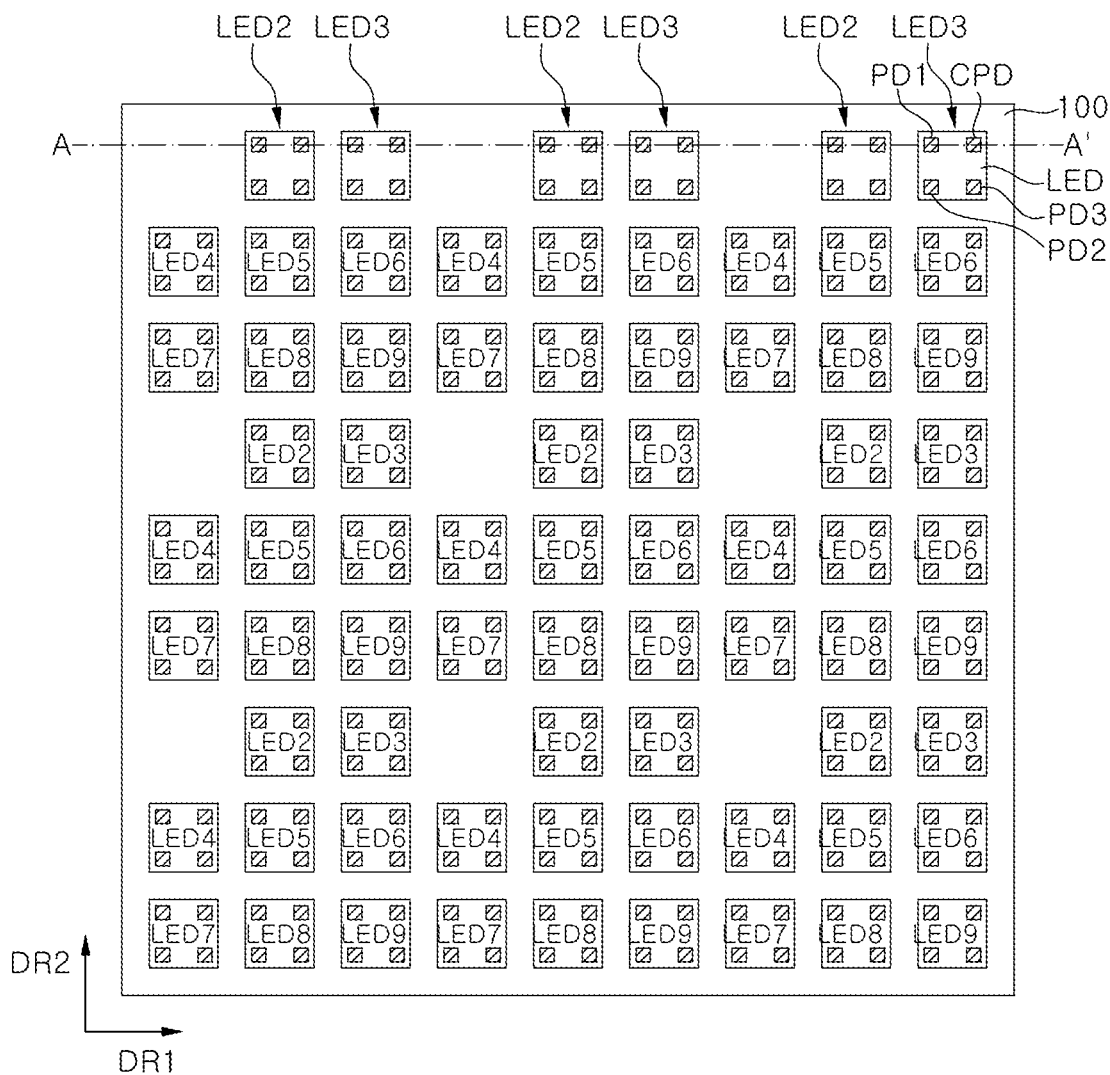
Figure 12B:
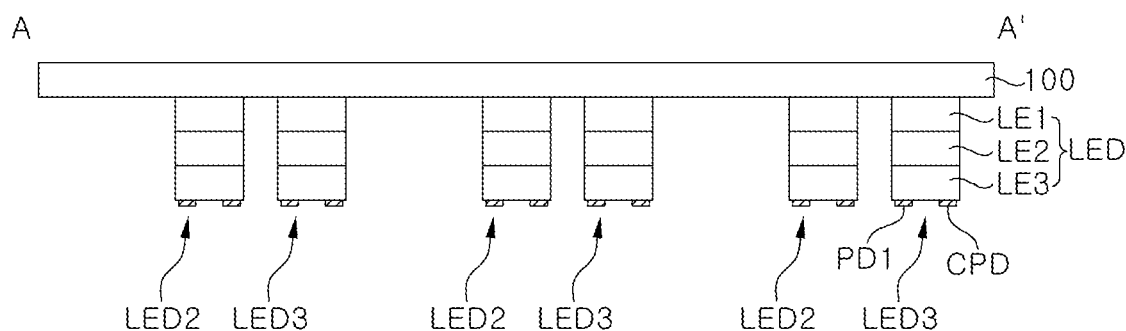

Referring to FIGS. 12A and 12B, the remaining light emitting cells LED except the first light emitting cells LED1 may be retained on the first substrate 100. The remaining light emitting cells LED may include second light emitting cells LED2, third light emitting cells LED3, fourth light emitting cells LED4, fifth light emitting cells LED5, sixth light emitting cells LED6, seventh light emitting cells LED7, eighth light emitting cells LED8, and ninth light emitting cells LED9. In this case, the terms, "second", "third", "fourth", "fifth", "sixth", "seventh", "eighth", and "ninth" refer to a sequence in which light emitting cells LED are separated from the first substrate 100, and these light emitting cells LED may not be different in terms of a structure and characteristics.

Figure 13A:
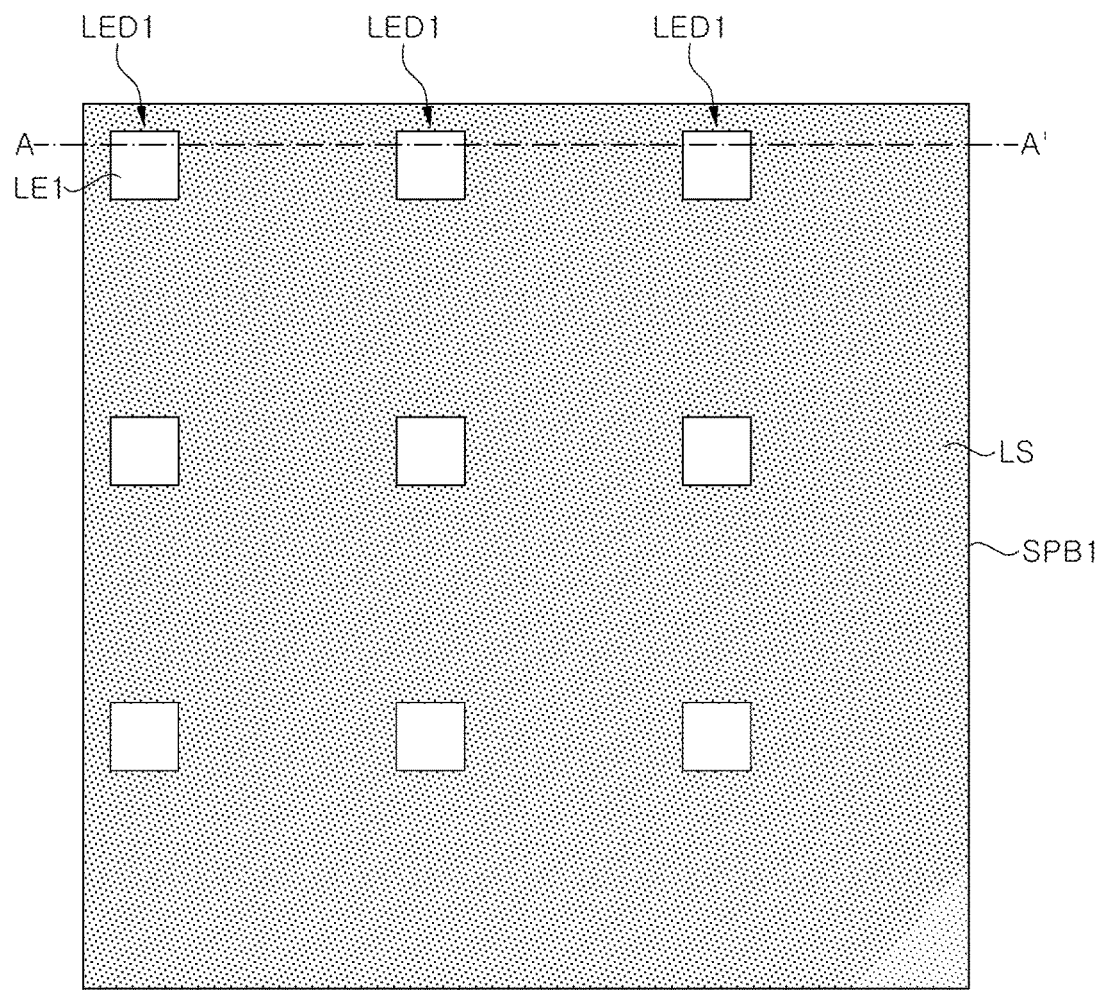
Figure 13B:
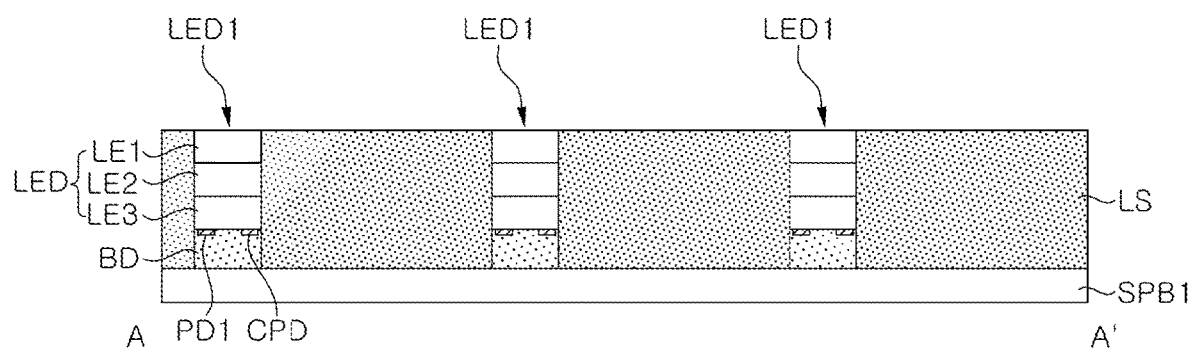

Referring to FIGS. 13A and 13B, a light shielding layer LS, which substantially fills an area between the first light emitting cells LED1 may be formed on the first support substrate SPB1. The light shielding layer LS may include a material, which has an insulation property and shields visible light, such as a black matrix or a photoresist.

Figure 14A:
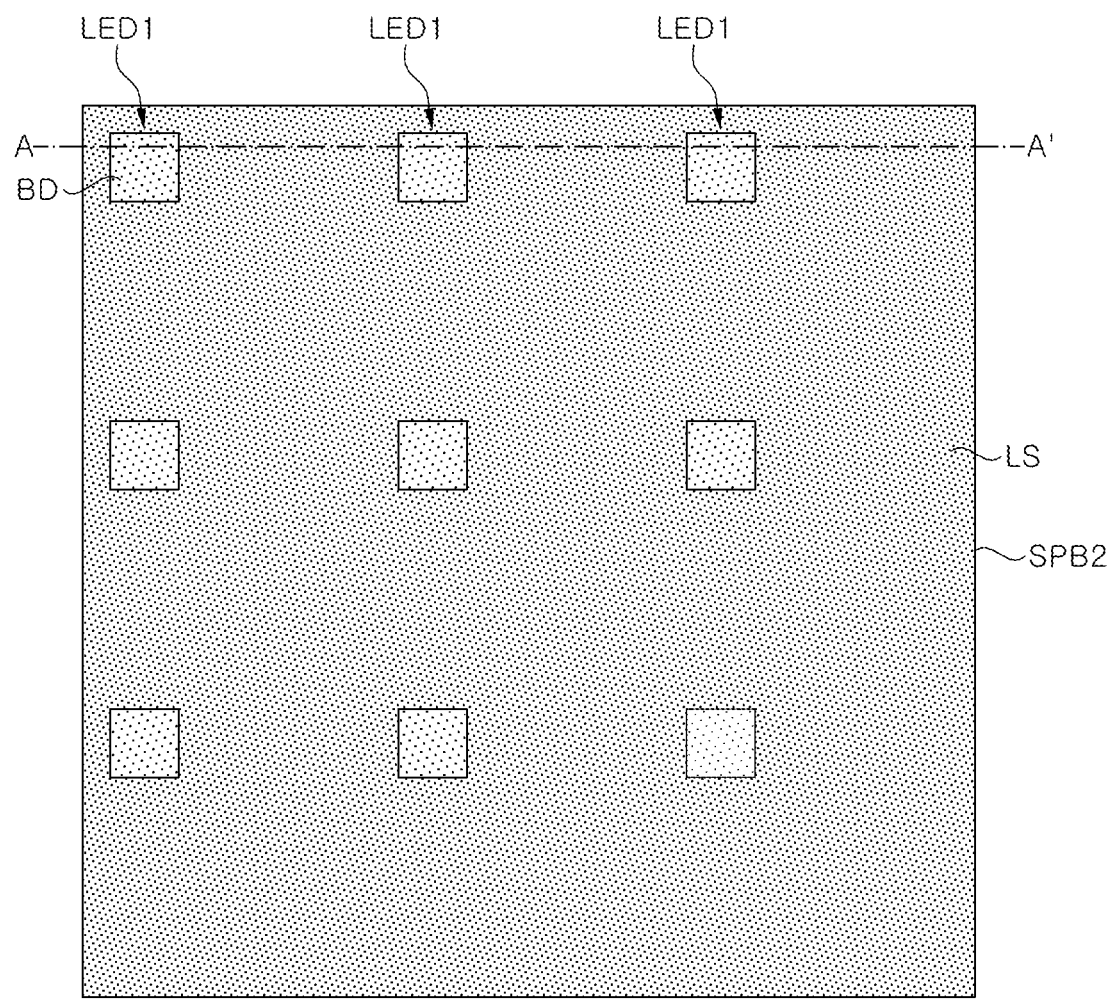
Figure 14B:
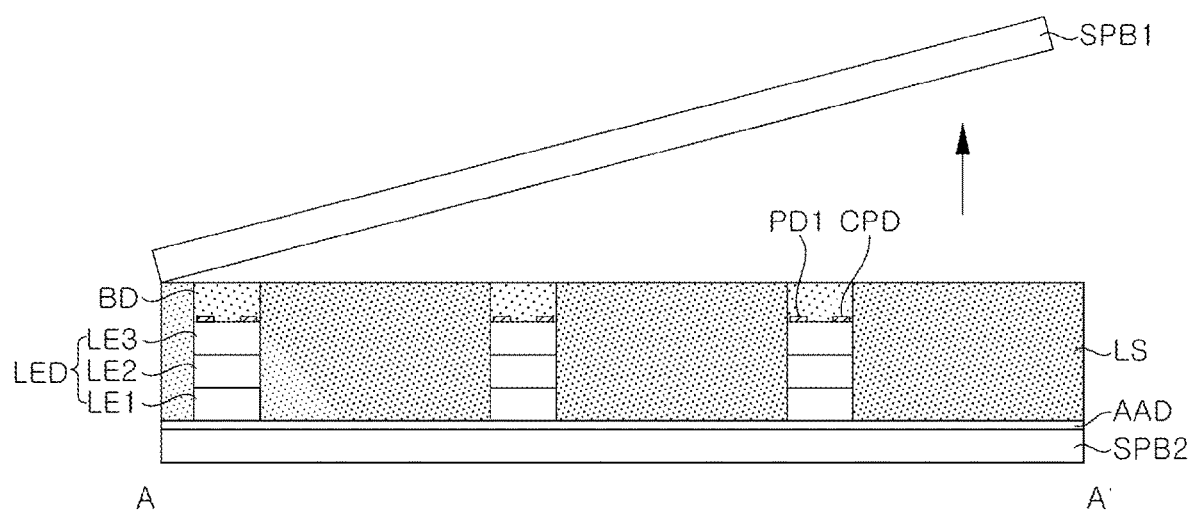

Referring to FIGS. 14A and 14B, a second support substrate SPB2 may be attached to one surface of the light emitting cells LED by using an adhesion part AAD. The second support substrate SPB2 may be a substrate, which temporarily supports the light emitting cells LED. As such, the type and structure of the second support substrate SPB2 are not particularly limited.

The adhesion part AAD may include a second polymer. According to an exemplary embodiment, the second polymer may have an etching selectivity for an etchant with respect to the first polymer included in the bonding parts BD. For example, by an etchant, the second polymer may be etched while the first polymer may not be etched. According to another exemplary embodiment, the second polymer may have a different melting point from the first polymer. For example, at 300° C., the second polymer may melt while the first polymer may not melt.

The adhesion part AAD may include at least one of a photoresist, epoxy, BCB, Flare™, MSSQ, PMMA, PDMS, fluoropolymer, a polyimide, MSSQ, PEEK, ATSP, PVDC, LCP, and a wax.

Then, the first support substrate SPB1 may be removed. For example, since each of the bonding parts BD includes an attachable/detachable bonding material, the first support substrate SPB1 may be removed from the bonding parts BD. By removing the first support substrate SPB1, the bonding parts BD may be exposed.

Figure 15A:
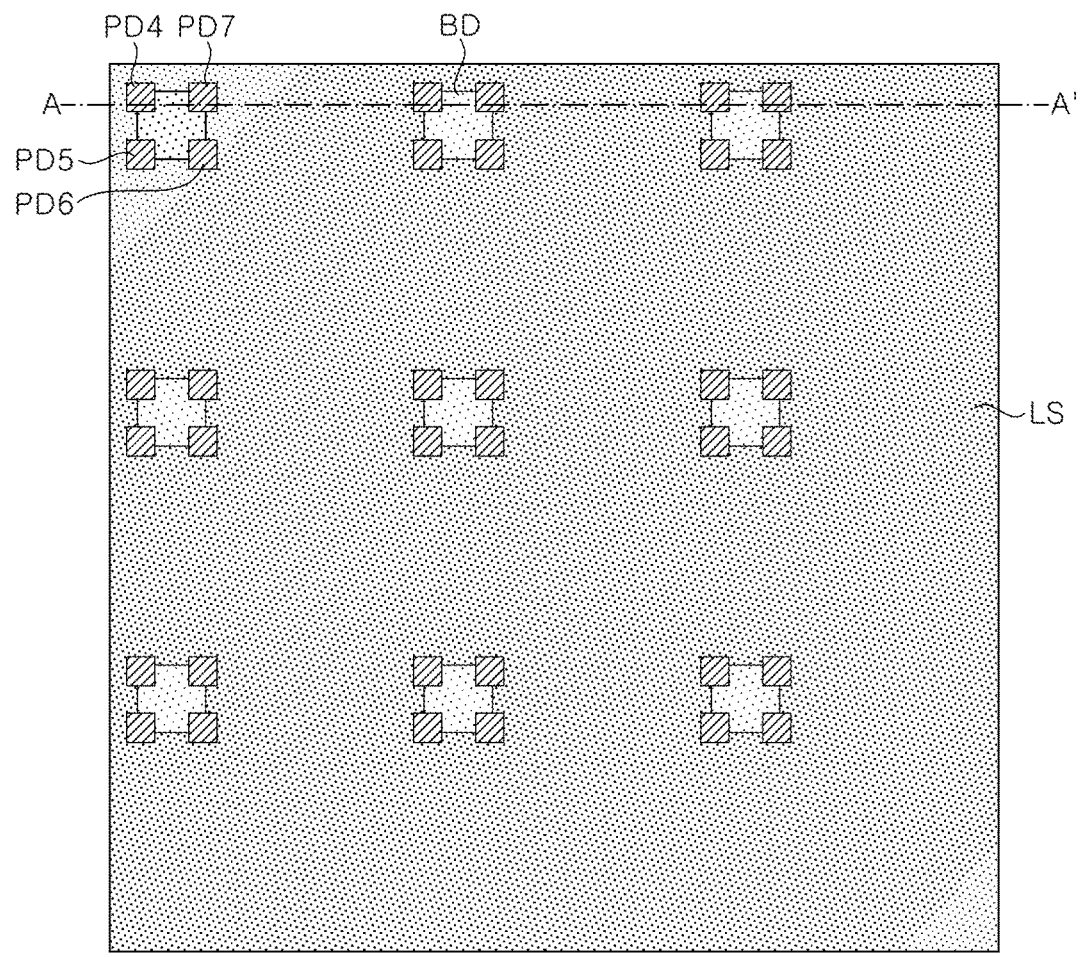
Figure 15B:
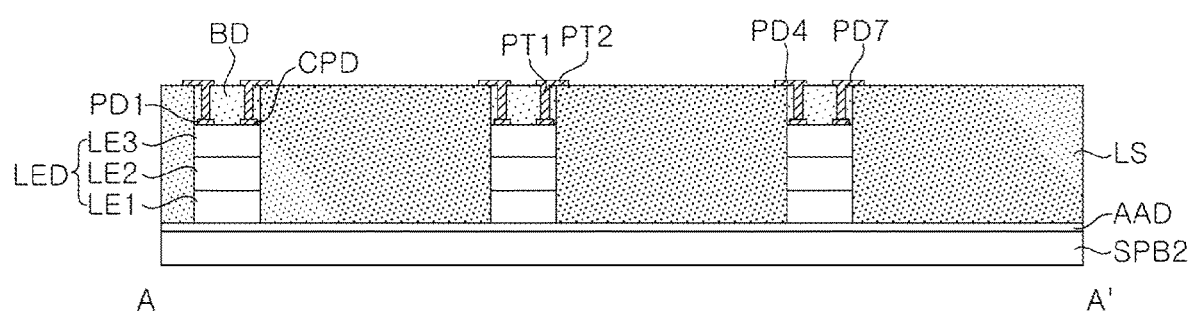

Referring to FIGS. 15A and 15B, a fourth pad PD4, a fifth pad PD5, a sixth pad PD6, and a seventh pad PD7, which pass the bonding part BD and are electrically coupled with the first pad PD1, the second pad PD2, the third pad PD3, and the common pad CPD, respectively, of each light emitting cell LED may be respectively formed. For example, each of the fourth pad PD4, the fifth pad PD5, the sixth pad PD6, and the seventh pad PD7 may extend onto the bonding part BD and the light shielding layer LS. As another example, each of the fourth pad PD4, the fifth pad PD5, the sixth pad PD6, and the seventh pad PD7 may extend on only the bonding part BD.

Figure 16A:
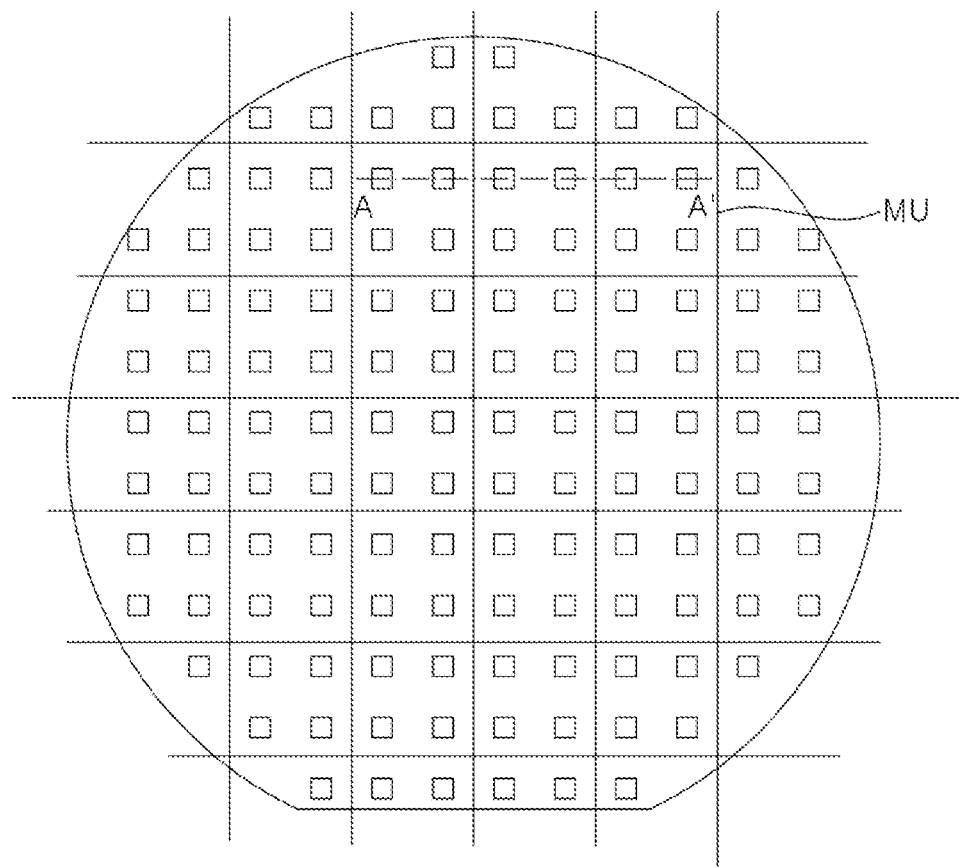
Figure 17A:
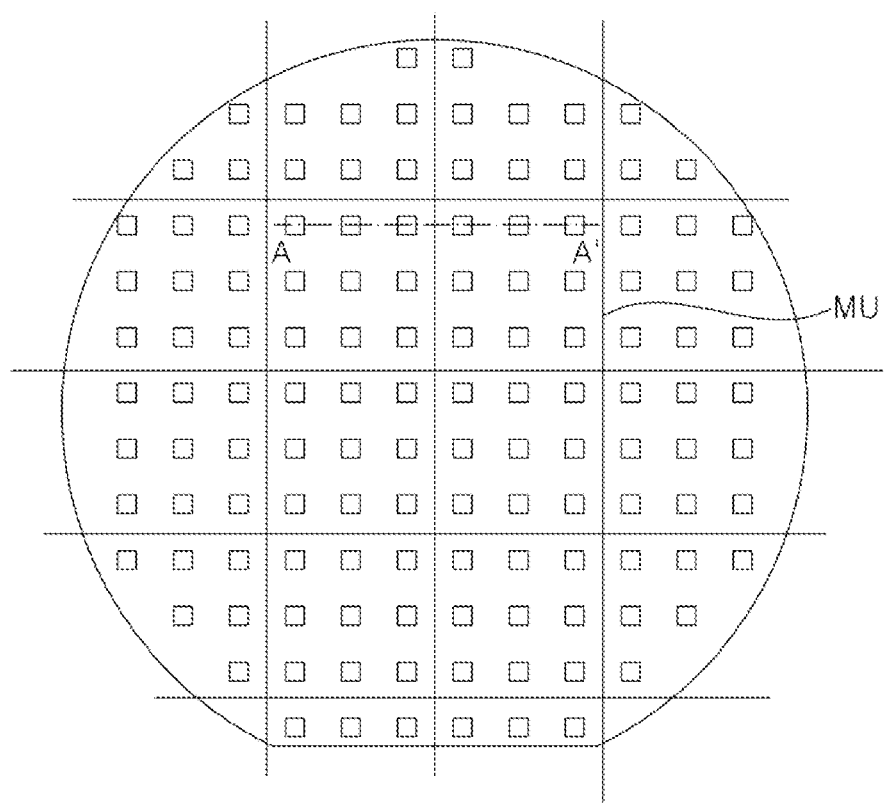

Referring to FIGS. 16A and 17A, when observing the second support substrate SPB2 from a wafer WF perspective, the first light emitting cells LED1 may be disposed on the second support substrate SPB2.

Since each of the first light emitting cells LED1 has a critical dimension (CD) of about 50 µm to about 80 µm, it is generally difficult to mount the first light emitting cells LED1 in one-by-one manner to a target mounting substrate MSUB due to the small size of the first light emitting cells LED1 and the number of the first light emitting cells LED1 to be transferred. As such, in order to mount several first light emitting cells LED1 at a time, a mounting unit MU including several first light emitting cells LED1 may be defined, and the second support substrate SPB2 may be cut in accordance with the mounting unit MU. The mounting unit MU may include at least two first light emitting cells LED1. The mounting unit MU may include the light shielding layer LS, which surrounds the outer sidewalls of the first light emitting cells LED1.

Figure 16B:
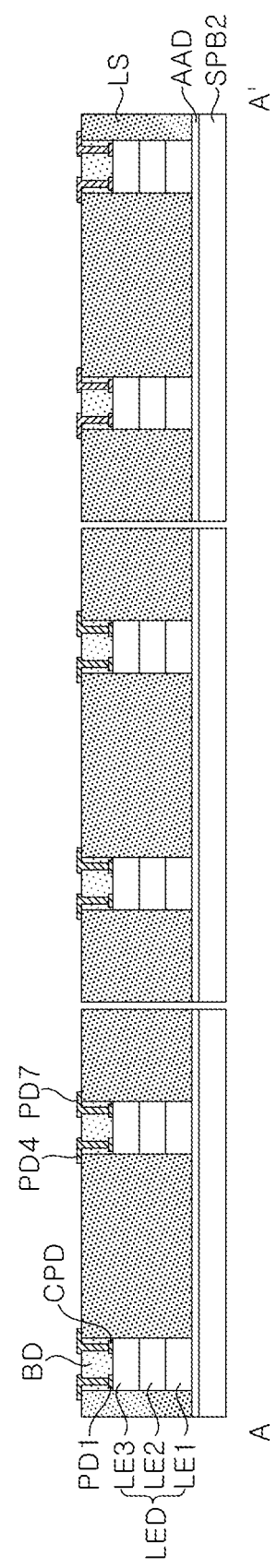

According to an exemplary embodiment, by cutting the second support substrate SPB2 in a mounting unit MU that includes the first light emitting cells LED1 arranged in a 2×2 configuration as shown in FIGS. 16A and 16B, four first light emitting cells LED1 in the mounting unit MU may be mounted at once.

Figure 17B:
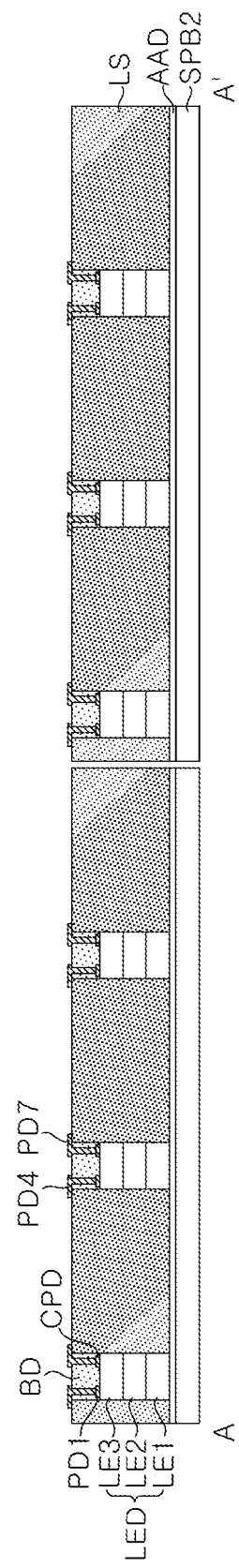

According to another exemplary embodiment, by cutting the second support substrate SPB2 in a mounting unit MU that includes the first light emitting cells LED1 arranged in a 3×3 configuration as shown in FIGS. 17A and 17B, nine first light emitting cells LED1 in the mounting unit MU may be mounted at once.

Figure 18A:
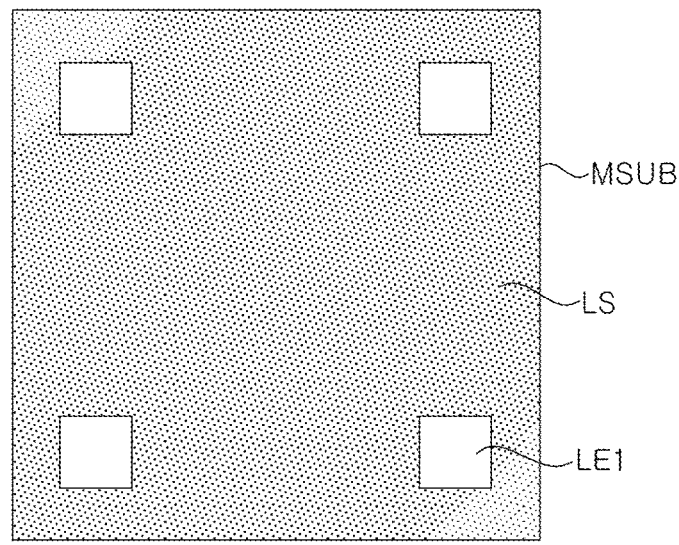
Figure 18B:
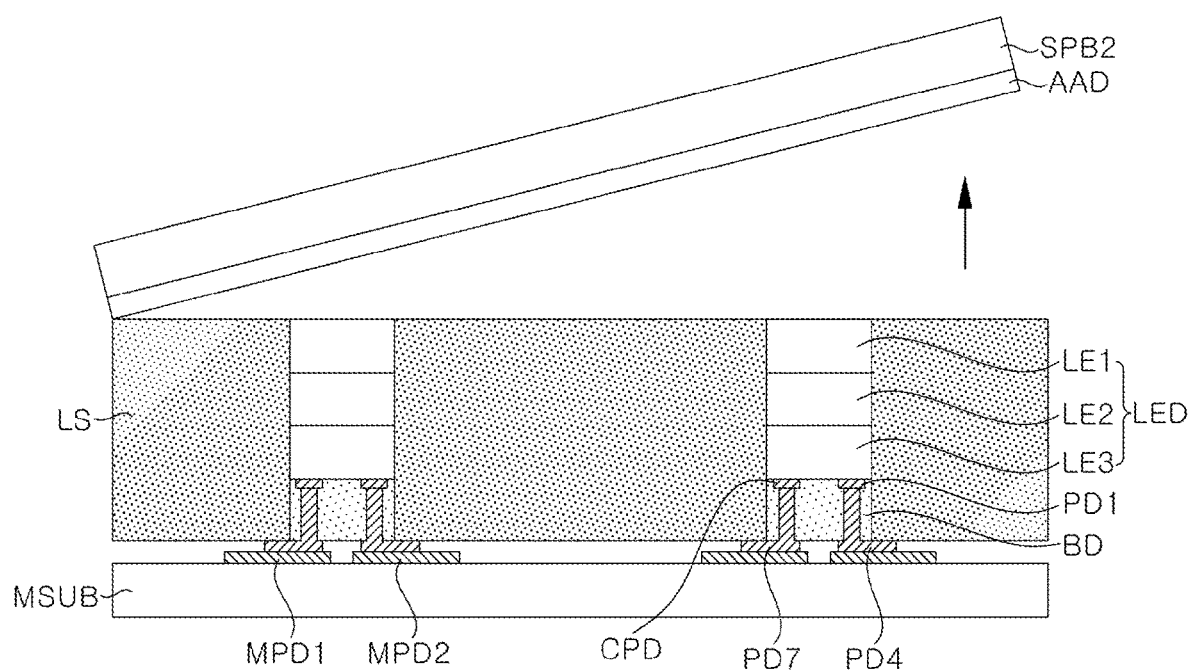

Referring to FIGS. 18A and 18B, the second support substrate SPB2 may be turned over, such that the first light emitting cells LED1 formed on the second support substrate SPB2, which are cut in accordance with to the mounting unit MU, may face the target mounting substrate MSUB. In the mounting substrate MSUB, mounting pads MPD may be formed at positions respectively corresponding to the fourth pad PD4, the fifth pad PD5, the sixth pad PD6, and the seventh pad PD7 of each of the first light emitting cells LED1.

The mounting pads MPD of the mounting substrate MSUB may be electrically bonded with fourth pads PD4, fifth pads PD5, sixth pads PD6, and seventh pads PD7 by using solder balls or the like.

Then, the second support substrate SPB2 may be removed.

While the first light emitting cells, which are cut in accordance to a mounting unit, have been described as being mounted to the mounting substrate MSUB, however, the inventive concepts are not limited thereto. For example, in some exemplary embodiments, a substrate formed with a BGA (ball grid array) may be used. As the BGA, metal balls including at least one of Au, In, Sn, Pb, and Cu may be formed on the substrate in the shape of a grid. In some exemplary embodiments, the substrate may include a circuit therein. In this case, the mounting unit MU may include the first light emitting cells, which are disposed to respectively correspond to the positions of the metal balls of the grid shape.

In this manner, among the 9×9 light emitting cells LED, the first light emitting cells LED1 may be mounted to the target mounting substrate MSUB. Since the structure and extending length of each of the fourth pad PD4, the fifth pad PD5, the sixth pad PD6, and the seventh pad PD7 may be changed depending on the mounting substrate MSUB, a light emitting device may be applied to various mounting substrates. Also, as the light shielding layer LS is formed between the first light emitting cells LED1 to shield light generated from neighboring first light emitting cells LED1, a color mixing may be prevented, thereby improving color reproducibility. Further, by defining the mounting unit MU including at least two first light emitting cells LED1 and mounting the first light emitting cells LED1 to the mounting substrate MSUB by the mounting unit MU, it is possible to efficiently and stably mount the first light emitting cells LED1 having a small critical dimension (CD), as compared to mounting the first light emitting cells LED1 in a one-by-one process.

Referring back to FIG. 12A, the second light emitting cells LED2, the third light emitting cells LED3, the fourth light emitting cells LED4, the fifth light emitting cells LED5, the sixth light emitting cells LED6, the seventh light emitting cells LED7, the eighth light emitting cells LED8, and the ninth light emitting cells LED9 may remain on the first substrate 100. By applying the processes shown in FIGS. 5A to 18B sequentially to the second light emitting cells LED2, the third light emitting cells LED3, the fourth light emitting cells LED4, the fifth light emitting cells LED5, the sixth light emitting cells LED6, the seventh light emitting cells LED7, the eighth light emitting cells LED8, and the ninth light emitting cells LED9, the plurality of light emitting cells LED in the wafer WF may be mounted to target mounting substrates MSUB.

In this manner, the first light emitting cells LED1, the second light emitting cells LED2, the third light emitting cells LED3, the fourth light emitting cells LED4, the fifth light emitting cells LED5, the sixth light emitting cells LED6, the seventh light emitting cells LED7, the eighth light emitting cells LED8, and the ninth light emitting cells LED9, which are densely formed at the first distance DT1 and the second distance DT2 may be separated into light emitting cells LED separated by the third distance DT3 and the fourth distance DT4, through separation processes performed nine times. More particularly, when light emitting cells LED separated by the third distance DT3 and the fourth distance DT4 are directly formed on the wafer WF, substantial portions of the wafer WF may be wasted by increased distances between the light emitting cells for separation. According to the exemplary embodiments because the densely formed light emitting cells LED are mounted through several separation processes as described above, portions of the wafer WF that would otherwise be wasted may be substantially reduced.

FIGS. 19 to 26 are cross-sectional views illustrating a method for manufacturing a light emitting device according to another exemplary embodiment.

Figure 19:
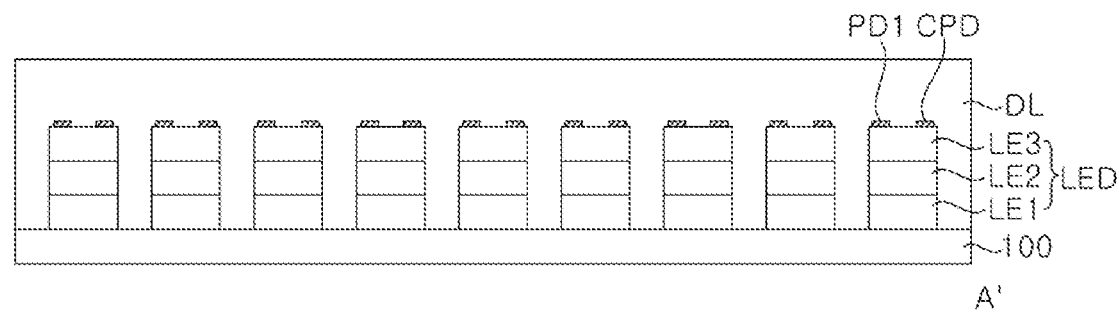
FIGS. 19, 20, 21, 22, 23, 24, 25, and 26 are cross-sectional views illustrating a method for manufacturing a light emitting device according to another exemplary embodiment.

Referring to FIG. 19, a plurality of light emitting cells LED may be formed on a first substrate 100.

Each of the light emitting cells LED may have a structure, in which a first light emitting part LE1, a second light emitting part LE2, and a third light emitting part LE3 are vertically stacked, and may be formed with a first pad PD1, a second pad PD2, a third pad PD3, and a common pad CPD. Since the process for forming the plurality of light emitting cells LED on the first substrate 100 is substantially the same as the process described above with reference to FIGS. 5A to 5C, repeated descriptions thereof will be omitted to avoid redundancy.

A dielectric layer DL, which covers the plurality of light emitting cells LED may be formed. The top surface of the dielectric layer DL may be higher than the top surfaces of the light emitting cells LED.

The dielectric layer DL may include a material, which has an etching selectivity for an etchant with respect to a bonding layer BDL to be subsequently formed. For example, the dielectric layer DL may include at least one of a silicon oxide, a silicon nitride or a silicon oxynitride.

Figure 20:
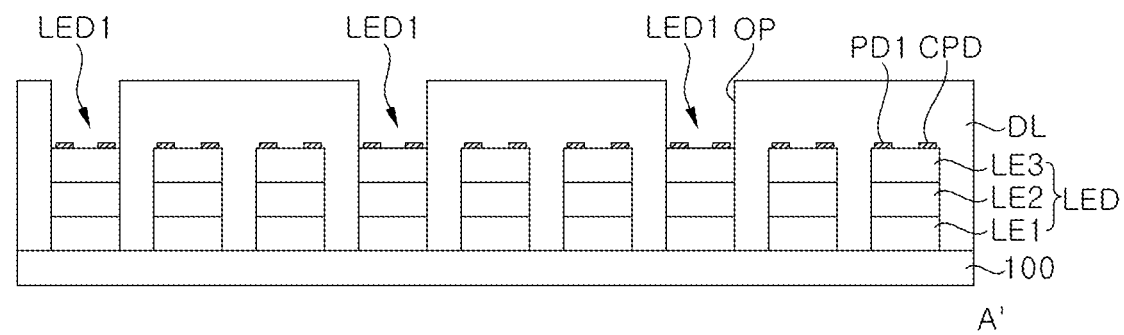

Referring to FIG. 20, by selectively etching the dielectric layer DL, openings OP may be formed on selected first light emitting cells LED1.

Figure 21:
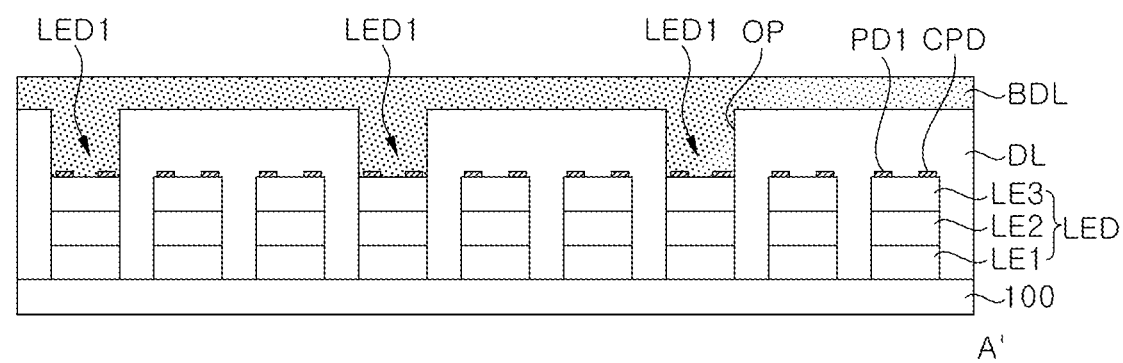

Referring to FIG. 21, the bonding layer BDL may be formed on the dielectric layer DL to substantially fill the openings OP. The bonding layer BDL may include a polymer, such as attachable/detachable polyurethane. Alternatively, the bonding layer BDL may include SOG, BCB, HSQ, or SU-8 photoresist.

Figure 22:
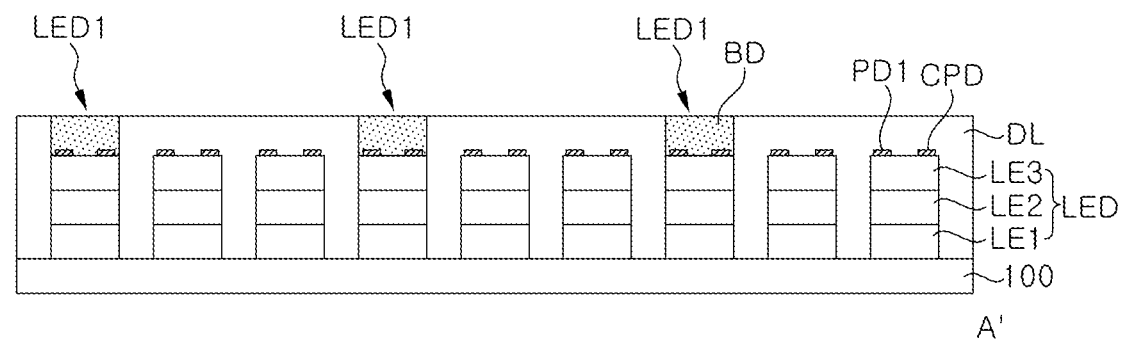

Referring to FIG. 22, by etching the bonding layer BDL to expose the top surface of the dielectric layer DL, bonding parts BD substantially filing the openings OP may be respectively formed. The bonding parts BD may be formed selectively on only the first light emitting cells LED1, respectively.

While the bonding layer BDL is etched as described above, the dielectric layer DL may not be substantially etched due to its etching selectivity against an etchant, which etches the bonding layer BDL.

Figure 23:
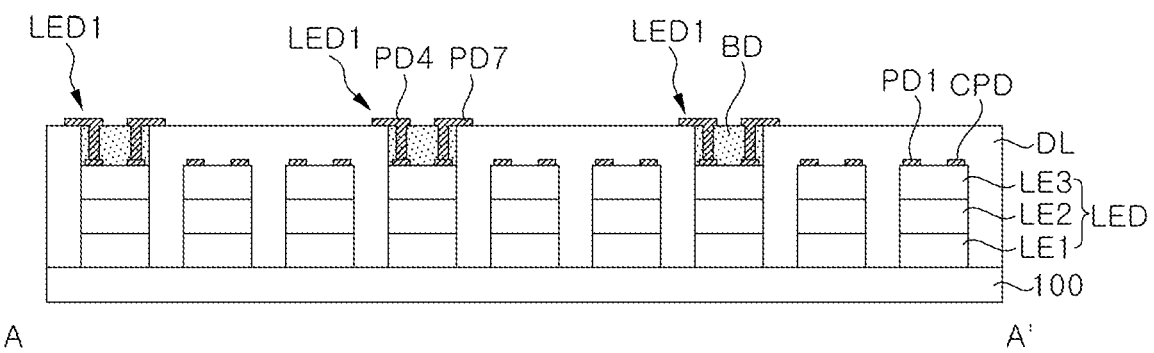

Referring to FIG. 23, a fourth pad PD4, a fifth pad PD5, a sixth pad PD6, and a seventh pad PD7, which pass through the bonding part BD and are electrically coupled with the first pad PD1, the second pad PD2, the third pad PD3, and the common pad CPD, respectively, of each of the first light emitting cells LED1 may be respectively formed.

Figure 24:
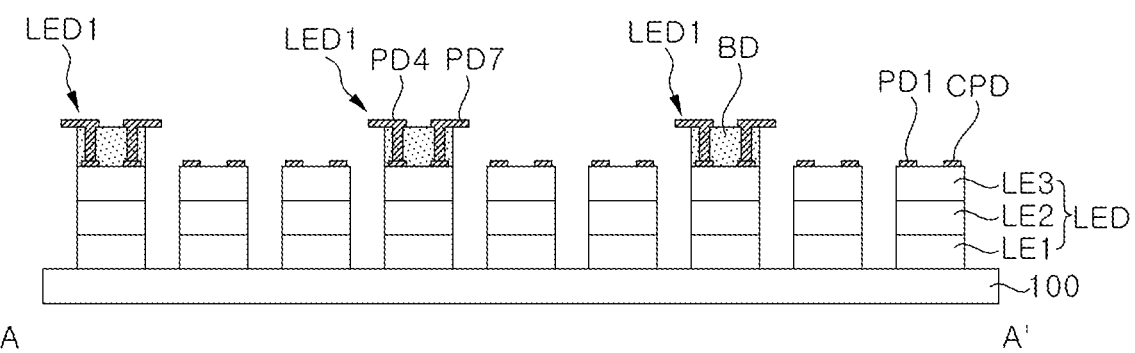

Referring to FIG. 24, the dielectric layer DL may be removed. In some exemplary embodiments, a process for removing the dielectric layer DL may be omitted.

Figure 25:
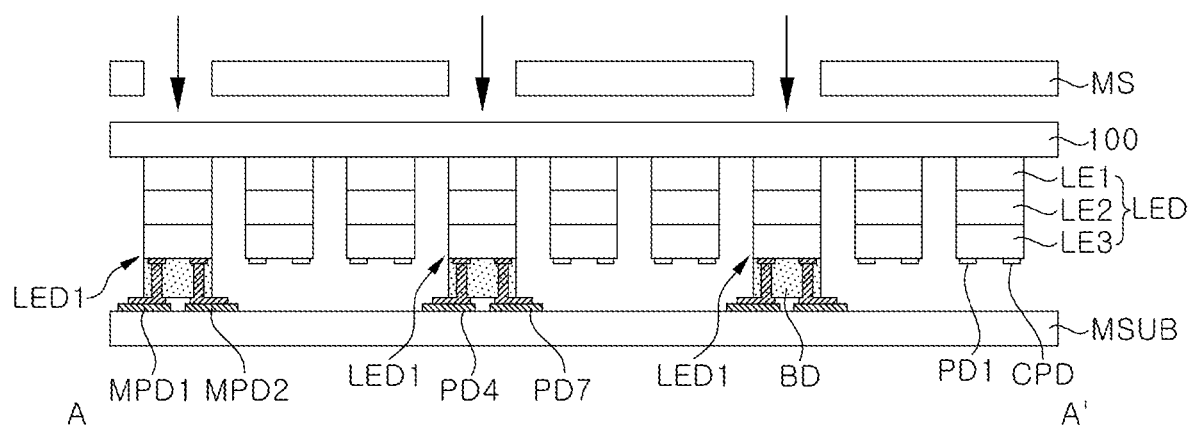
Figure 26:
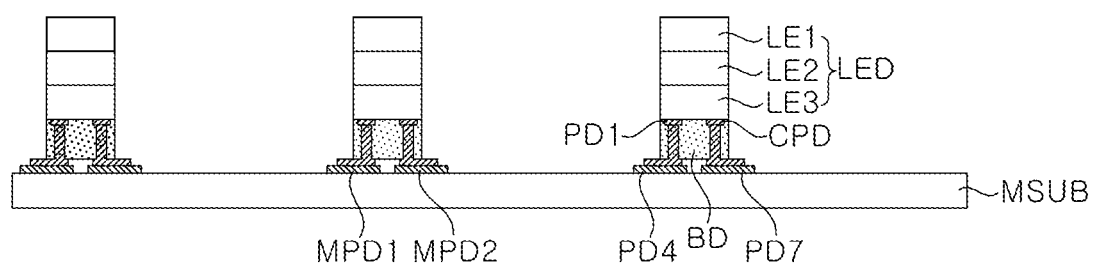

Referring to FIGS. 24 to 26, by turning over the first substrate 100, the first light emitting cells LED1 may face a target substrate. According to the illustrated exemplary embodiment, by turning over the first substrate 100, the first light emitting cells LED1 formed with the bonding parts BD may face a mounting substrate MSUB.

A mask pattern MS may be formed on the first substrate 100. The mask pattern MS may include openings OP at positions corresponding to the first light emitting cells LED1. By performing a selective laser lift-off process through the openings OP, the first light emitting cells LED1 may be separated from the first substrate 100. The separated first light emitting cells LED1 may be selectively mounted onto the mounting substrate MSUB by the bonding parts BD, respectively.

In some exemplary embodiments, a light shielding layer LS, which substantially fills an area between the light emitting cells LED, may be additionally formed as shown in FIG. 1C. The light shielding layer LS may have a top surface coplanar with one surface of each of the first light emitting part LE1. Also, the light shielding layer LS may fill between the mounting substrate MSUB and the light emitting cells LED.

In FIG. 25, the other light emitting cells LED except the first light emitting cells LED1 may be retained on the first substrate 100 as shown in FIGS. 12A and 12B, which may be mounted to target mounting substrates MSUB by repeating the method described above with reference to FIGS. 19 to 26.

The method for manufacturing a light emitting device shown in FIGS. 5A, 5C, 6A to 18A, and 5B to 18B was described as an example. The light emitting device shown in FIGS. 1A and 1B may also be manufactured through a substantially similar method to be described hereunder.

Light emitting cells may be formed on a first substrate. A first surface of each of the light emitting cells may be a surface, on which a first pad, a second pad, a third pad, and a common pad are exposed. A second surface opposing the first surface may face the first substrate.

First adhesion parts may be formed on a first support substrate. The first adhesion parts may include a first polymer. After turning over the first substrate and disposing the first substrate, such that the first surfaces of the respective light emitting cells face the first adhesion parts, by performing a laser lift-off process, the light emitting cells may be separated from the first substrate. The separated light emitting cells may be transferred to the first support substrate. The first surfaces of the respective light emitting cells transferred to the first support substrate may face the first support substrate, and the second surfaces of the respective light emitting cells may be exposed.

Second adhesion parts may be formed on a second substrate. The second adhesion parts may include a second polymer. For example, the second polymer may be different in terms of solubility to an etchant from the first polymer. As another example, the second polymer may be different in terms of melting point from the first polymer.

After turning over the first support substrate and disposing the first support substrate, such that the second surfaces of the respective light emitting cells face the second adhesion parts, by removing the first adhesion parts, the light emitting cells may be separated from the first support substrate. For example, an etchant may dissolve the first adhesion parts but may not dissolve the second adhesion parts. As another example, at a predetermined temperature, the first adhesion parts may melt, but the second adhesion parts may be cured. The second surfaces of the respective light emitting cells transferred to the second support substrate may face the second support substrate, and the first surfaces of the respective light emitting cells may be exposed. In particular, the first pad, the second pad, the third pad, and the common pad of each of the light emitting cells may be exposed.

Through the above-described processes, bonding parts may be selectively formed only on the first light emitting cells. Each of the bonding parts may include a third polymer. For example, the third polymer may be different in terms of solubility to an etchant from the second polymer. As another example, the third polymer may be different in terms of melting point from the second polymer.

Then, a fourth pad, a fifth pad, a sixth pad, and a seventh pad, which pass through the respective bonding parts and are electrically coupled with the first pad, the second pad, the third pad, and the common pad of each of the light emitting cells may be formed. The first surfaces of the first light emitting cells may be surfaces, on which fourth pads, fifth pads, sixth pads, and seventh pads are exposed.

After preparing a third support substrate and turning over the second support substrate, and thereby disposing the second support substrate, such that the first surfaces of the respective light emitting cells face the third support substrate, the first light emitting cells may be selectively separated from the second support substrate. For example, in the process for selectively separating the first light emitting cells, after masking the other light emitting cells except the first light emitting cells, by selectively dissolving, through using an etchant, only the second adhesion parts which bond the first light emitting cells, the first light emitting cells may be separated from the second support substrate. The etchant may selectively dissolve the second adhesion parts. As another example, in the process for selectively separating the first light emitting cells, by performing thermal treatment selectively on portions of the third support substrate, where the first light emitting cells are positioned, and thereby selectively dissolving the second adhesion parts which bond the first light emitting cells, the first light emitting cells may be separated from the second support substrate.

The first light emitting cells separated from the third support substrate may then be mounted to a mounting substrate through the processes described above with reference to FIGS. 12A to 18A and 12B to 18B.

In the light emitting device according to the exemplary embodiments, as light emitting cells, which are densely formed on a wafer, are selectively individualized through multiple processes to be separated from one another by a predetermined distance, it is possible to transfer the light emitting cells in a desired target distance. As such, when compared to directly forming light emitting cells separated by a target distance, it is possible to reduce a portion of the wafer to be wasted for obtaining a desired separation distance between the light emitting cells to be transferred.

In addition, by mounting the light emitting cells each having a small critical dimension by a mounting unit including at least two light emitting cells, rather than in a one-by-one manner, it is possible to prevent a shock or a damage from occurring during the mounting, and it is possible to efficiently mount the light emitting cells to a target apparatus.

Moreover, because a light shielding layer is disposed between light emitting cells, lights generated from the light emitting cells may be shielded to prevent the occurrence of a color mixing, which may improve the color reproducibility of a light emitting device.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A light emitting device comprising:
   a substrate;
   at least two light emitting cells disposed on the substrate;
   a light shielding layer comprising an insulative material, disposed between the at least two light emitting cells, and having openings each exposing one surface of each of the light emitting cells; and
   a plurality of pad parts disposed between the substrate and one of the light emitting cells, and including a first part and a second part between the substrate and one of the light emitting cells,
   wherein a side surface of the light shielding layer is substantially flush with a side surface of the one of the light emitting cells,
   wherein the plurality of pad parts extend outwardly away from the one of the light emitting cells, such that a portion of each of the pad parts does not overlap the one of the light emitting cells in a plan view,
   wherein the light shieling layer covers the portion of each of the pad parts, and
   wherein the second part extends from the first part and has a width different from the first part, and at least a portion of each the first part and the second part overlaps the light shielding layer.

2. The light emitting device according to claim 1, wherein the light shielding layer contacts side surfaces of the at least two light emitting cells.

3. The light emitting device according to claim 1, further comprising bonding parts filling the openings, and disposed between the light emitting cells and the substrate,
   wherein the light shielding layer contacts the substrate and is disposed between the bonding parts and the substrate.

4. The light emitting device according to claim 1, wherein a separation distance between two neighboring light emitting cells is about 8 to about 15 times a critical dimension of each of the light emitting cells.

5. The light emitting device according to claim 1, wherein each of the light emitting cells comprises a first light emitting part, a second light emitting part, and a third light emitting part vertically stacked one over another, and a plurality of pads electrically coupled with the first, second, and third light emitting parts.

6. The light emitting device according to claim 5, further comprising:
   bonding parts filling the openings, and disposed between the light emitting cells and the substrate; and
   through electrodes passing through the bonding parts and electrically coupled with the pads.

7. The light emitting device according to claim 6, wherein each of the through electrodes comprises:
   a first portion disposed within each of the bonding parts; and
   a second portion extending from the first portion onto a top surface of each of the bonding parts while being insulated from the bonding parts, at least a part of the second portion contacting the light shielding layer, and wherein the plurality of the pad parts includes the second portion of the through electrode.

8. The light emitting device according to claim 7, wherein the second portion extends to one surface of the light shielding layer facing the substrate.

9. The light emitting device according to claim 7, wherein the second portion extends into the light shielding layer.

10. The light emitting device according to claim 7, wherein the substrate comprises a plurality of substrate pads disposed at positions corresponding to the second portions of the through electrodes, wherein the plurality of the pad parts further includes the substrate pad.

11. The light emitting device according to claim 1, wherein the light shielding layer comprises at least one of a photoresist and a black matrix.

12. The light emitting device according to claim 1, wherein one surface of each of the at least two light emitting cells facing away from the substrate is coplanar with one surface of the light shielding layer facing away from the substrate.

\* \* \* \* \*